United States Patent
Jung et al.

(10) Patent No.: US 11,869,938 B2
(45) Date of Patent: Jan. 9, 2024

(54) SEMICONDUCTOR DEVICE

(71) Applicant: SAMSUNG ELECTRONICS CO., LTD., Suwon-si (KR)

(72) Inventors: Hae Geon Jung, Yongin-si (KR); Dong Kwon Kim, Suwon-si (KR); Cheol Kim, Hwaseong-si (KR)

(73) Assignee: Samsung Electronics Co., Ltd.

( * ) Notice: Subject to any disclaimer, the term of this patent is extended or adjusted under 35 U.S.C. 154(b) by 172 days.

(21) Appl. No.: 17/516,192

(22) Filed: Nov. 1, 2021

(65) Prior Publication Data

US 2022/0344461 A1 Oct. 27, 2022

(30) Foreign Application Priority Data

Apr. 27, 2021 (KR) .................. 10-2021-0054234

(51) Int. Cl.
*H01L 29/06* (2006.01)
*H01L 29/423* (2006.01)
*H01L 29/08* (2006.01)

(52) U.S. Cl.
CPC ...... *H01L 29/0665* (2013.01); *H01L 29/0847* (2013.01); *H01L 29/4236* (2013.01)

(58) Field of Classification Search
CPC ......... H01L 21/02603; H01L 21/76224; H01L 21/823481; H01L 21/823878; H01L 29/0649; H01L 29/0665; H01L 29/0669; H01L 29/0673; H01L 29/0847; H01L 29/42308; H01L 29/66439; H01L 29/775
See application file for complete search history.

(56) References Cited

U.S. PATENT DOCUMENTS

| | | | |
|---|---|---|---|
| 10,510,873 B2 | 12/2019 | Ching et al. | |
| 10,510,874 B2 | 12/2019 | Ching et al. | |
| 10,529,833 B2 | 1/2020 | Ching et al. | |
| 10,672,879 B2 | 6/2020 | Tsai et al. | |
| 10,763,255 B2 | 9/2020 | Ching et al. | |
| 10,770,571 B2 | 9/2020 | Hsu et al. | |
| 10,872,891 B2 | 12/2020 | Lin et al. | |
| 10,879,351 B2 | 12/2020 | Ching et al. | |
| 11,664,454 B2 * | 5/2023 | Chiang ........... H01L 21/823814 257/288 |
| 2019/0139957 A1 | 5/2019 | Liao et al. | |
| 2020/0020782 A1 | 1/2020 | Ching et al. | |
| 2020/0083222 A1 | 3/2020 | Kim et al. | |
| 2020/0357805 A1 | 11/2020 | Reznicek et al. | |
| 2021/0343713 A1 * | 11/2021 | Ju ..................... H01L 29/42392 |
| 2022/0344333 A1 * | 10/2022 | Jhan ................ H01L 21/823481 |
| 2022/0359711 A1 * | 11/2022 | Lu ..................... H01L 29/42392 |

* cited by examiner

*Primary Examiner* — David C Spalla
(74) *Attorney, Agent, or Firm* — Myers Bigel, P.A.

(57) ABSTRACT

A semiconductor device includes a substrate, a first active pattern that includes a first side wall and a second side wall opposite to the first side wall in a second horizontal direction, a first insulating structure in a first trench extending in the first horizontal direction on the first side wall of the first active pattern, a second insulating structure in a second trench extending in the first horizontal direction on the second side of the first active pattern, and includes a first insulating layer on side walls and a bottom surface of the second trench, and a second insulating layer in the second trench on the first insulating layer, a gate-cut extending in the first horizontal direction on the first insulating structure, and a gate electrode extending in the second horizontal direction on the first active pattern.

19 Claims, 45 Drawing Sheets

SEMICONDUCTOR DEVICE

CROSS-REFERENCE TO RELATED APPLICATION

This application claims priority from Korean Patent Application No. 10-2021-0054234 filed on Apr. 27, 2021 in the Korean Intellectual Property Office, and all the benefits accruing therefrom under 35 U.S.C. 119, the contents of which in its entirety are herein incorporated by reference.

BACKGROUND

The present invention relates to a semiconductor device. Specifically, the present disclosure relates to a semiconductor device including an MBCFET™ (Multi-Bridge Channel Field Effect Transistor).

With the rapid spread of information media in recent years, the functions of semiconductor devices have also been dramatically developed. In the case of the recent semiconductor products, a low cost improves market competitiveness, and high integration of products may be needed for high quality. The semiconductor devices are being scaled down for high integration.

On the other hand, as a pitch size decreases, there is a need for research for securing a decrease in capacitance and electrical stability between contacts in the semiconductor device.

SUMMARY

Aspects of the present disclosure provide a semiconductor device in which a formation depth of a gate-cut is reduced by forming an insulating structure under the gate-cut. As a result, the difficulty of the etching process for forming the gate-cut may be reduced by securing the margin of an etching process for forming the gate-cut.

According to some embodiments of the present disclosure, there is provided a semiconductor device, including a substrate, a first active pattern which extends in a first horizontal direction on the substrate, and includes a first side wall and a second side wall opposite to the first side wall in a second horizontal direction different from the first horizontal direction, a first insulating structure in a first trench extending in the first horizontal direction on the first side wall of the first active pattern, a second insulating structure in a second trench extending in the first horizontal direction on the second side wall of the first active pattern, and includes a first insulating layer on side walls and a bottom surface of the second trench, and a second insulating layer in the second trench on the first insulating layer, a gate-cut extending in the first horizontal direction on the first insulating structure, and a gate electrode extending in the second horizontal direction on the first active pattern. The first insulating layer and the second insulating layer include different materials from each other, the first insulating structure and the first insulating layer include a same material, and an upper surface of the first insulating structure is on a same plane as an upper surface of the second insulating layer.

According to some embodiments of the present disclosure, there is provided a semiconductor device, including a substrate, an active pattern which extends in a first horizontal direction on the substrate, and includes a first side wall and a second side wall opposite to the first side wall in a second horizontal direction different from the first horizontal direction, a plurality of nanosheets spaced apart from each other in a vertical direction on the active pattern, a first insulating structure in a first trench extending in the first horizontal direction on the first side wall of the active pattern, a second insulating structure in a second trench extending in the first horizontal direction on the second side wall of the active pattern, and includes a first insulating layer on side walls and a bottom surface of the second trench, and a second insulating layer in the second trench on the first insulating layer, a gate-cut extending in the first horizontal direction on the first insulating structure, a gate electrode which extends in the second horizontal direction on the active pattern and surrounds the plurality of nanosheets in the second horizontal direction, and a gate insulating layer between the gate electrode and the plurality of nanosheets, and between the gate electrode and the gate-cut.

According to some embodiments of the present disclosure, there is provided a semiconductor device, including a substrate, first, second, and third active patterns which each extend in a first horizontal direction on the substrate, and are spaced apart from one another in a second horizontal direction different from the first horizontal direction, a field insulating layer on side walls of each of the first, second, and third active patterns on the substrate, a plurality of nanosheets such that first, second, and third groups of the plurality of nanosheets are on the first, second, and third active patterns and nanosheets of each of the first, second, and third groups of the plurality of nanosheets are spaced apart from each other in a vertical direction, a first insulating structure in a first trench extending in the first horizontal direction between the first active pattern and the second active pattern, and at least partially extends into the field insulating layer, a second insulating structure in a second trench extending in the first horizontal direction between the second active pattern and the third active pattern, and includes a first insulating layer on side walls and a bottom surface of the second trench, and a second insulating layer in the second trench on the first insulating layer, the second insulating structure at least partially extends into the field insulating layer, a gate-cut extending in the first horizontal direction on the first insulating structure, a gate electrode which extends in the second horizontal direction on the first to third active patterns and surrounds the plurality of nanosheets in the second horizontal direction, a gate insulating layer between the gate electrode and the plurality of nanosheets, and between the gate electrode and the gate-cut, and a source/drain region on at least one side of the gate electrode. The first insulating layer and the second insulating layer include different materials from each other, the first insulating structure and the first insulating layer include a same material, and an upper surface of the first insulating structure, an upper surface of the first insulating layer, and an upper surface of the second insulating layer are on a same plane as each other.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTIONS

Although drawings of a semiconductor device according to some embodiments explain a case that includes a MBCFET™ (Multi-Bridge Channel Field Effect Transistor) including a nanosheet and a fin-type transistor (FinFET) including a channel region of a fin-type pattern shape as an example, the present disclosure is not limited thereto.

Hereinafter, a semiconductor device according to some embodiments of the present disclosure will be described referring to FIGS. 1 to 4.

Figure 1:
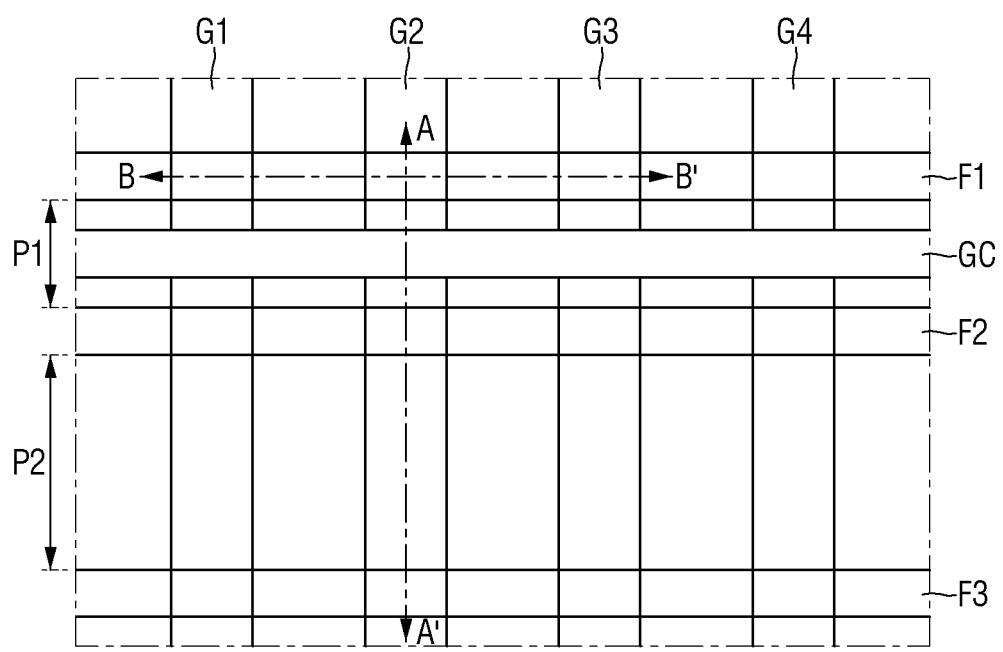
FIGS. 1 and 2 are schematic layout views for explaining a semiconductor device according to some embodiments of the present disclosure.
Figure 1:
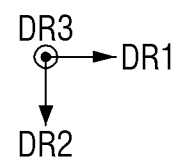
Figure 2:
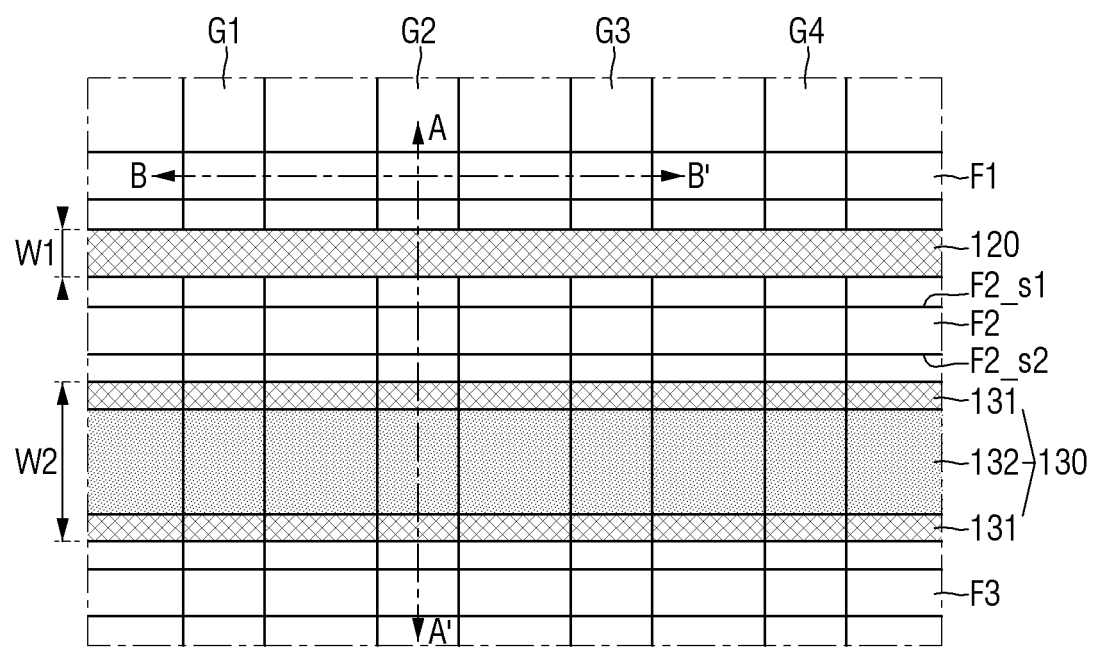
Figure 2:
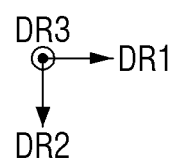
Figure 3:
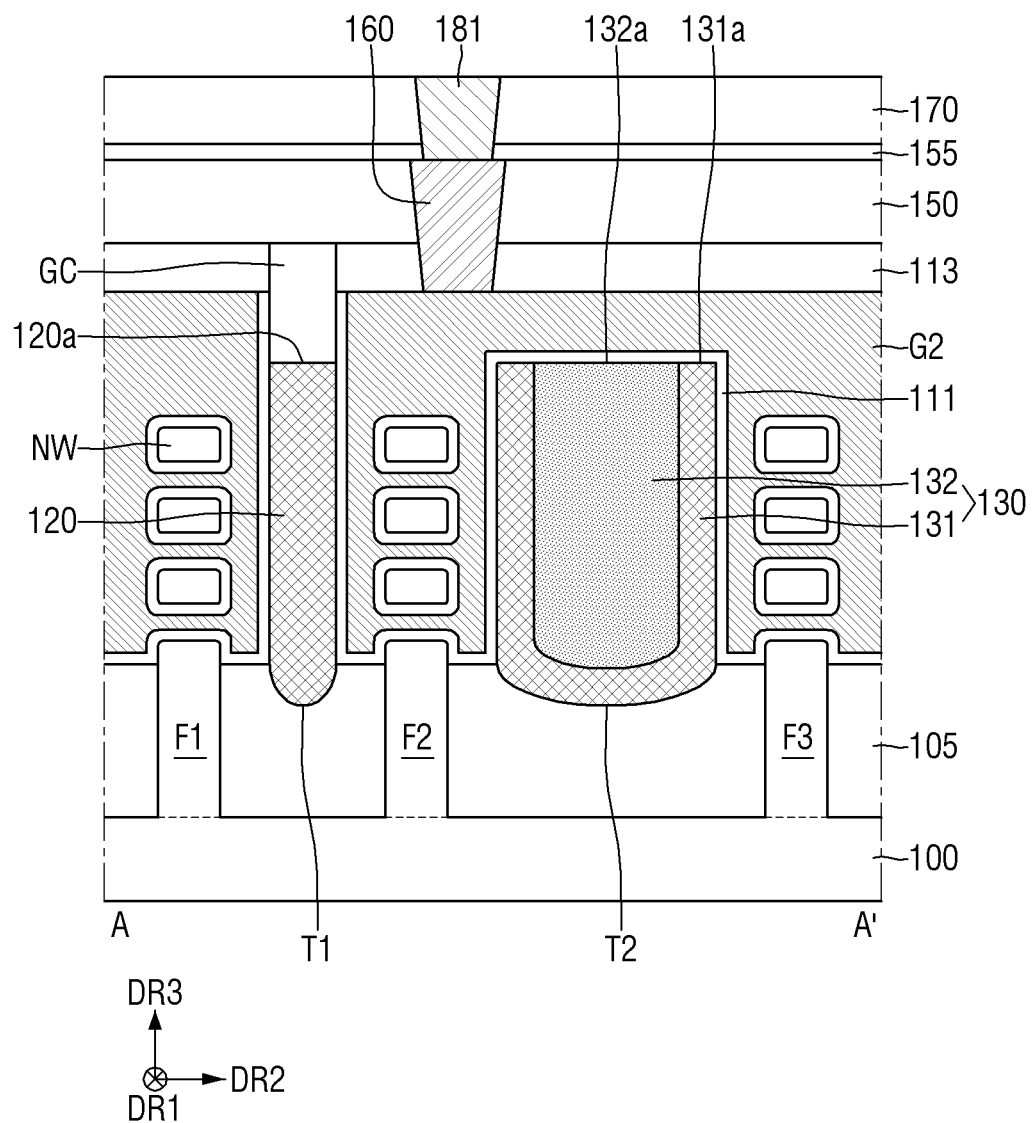
FIG. 3 is a cross-sectional view taken along a line A-A' of each of FIGS. 1 and 2.
Figure 4:
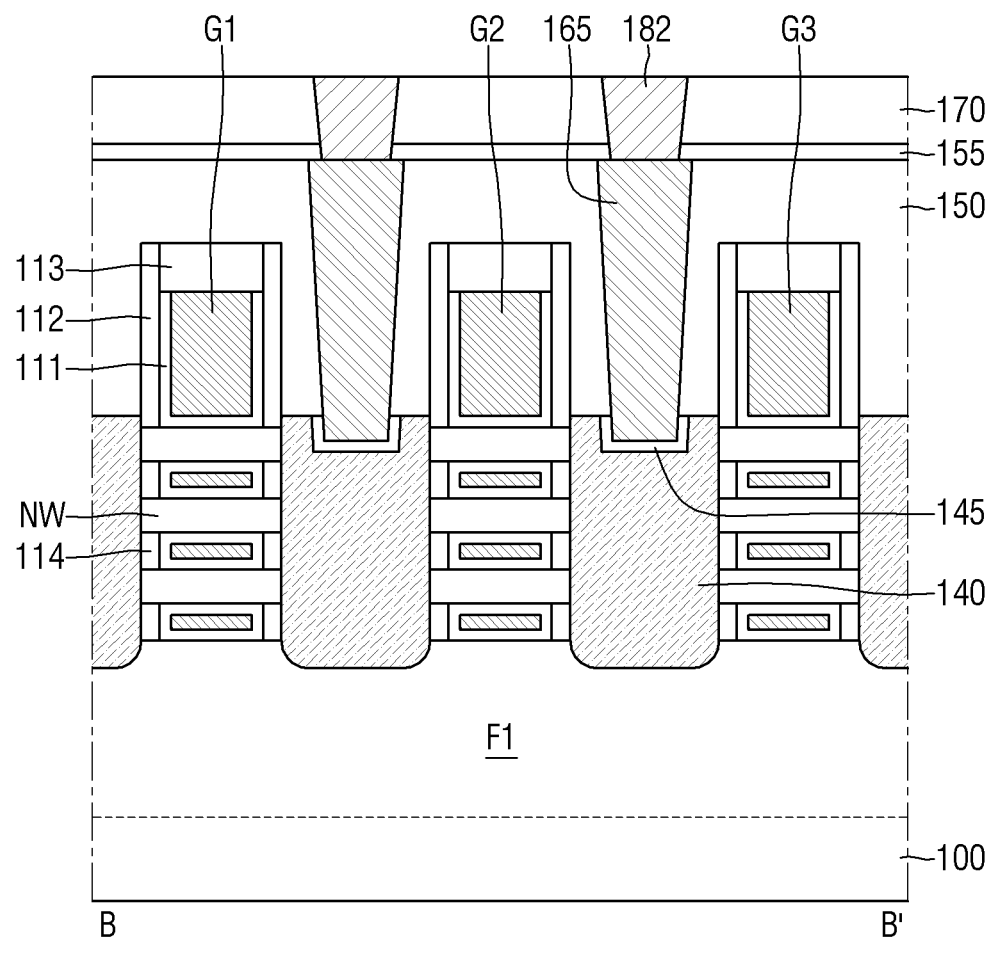
FIG. 4 is a cross-sectional view taken along a line B-B' of each of FIGS. 1 and 2.
Figure 4:
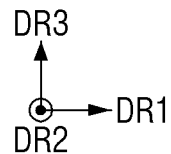

FIGS. 1 and 2 are schematic layout views for explaining a semiconductor device according to some embodiments of the present disclosure. FIG. 3 is a cross-sectional view taken along a line A-A' of each of FIGS. 1 and 2. FIG. 4 is a cross-sectional view taken along a line B-B' of each of FIGS. 1 and 2.

Referring to FIGS. 1 to 4, the semiconductor device according to some embodiments of the present disclosure includes a substrate 100, first to third active patterns F1, F2 and F3, and a field insulating layer 105, a plurality of nanosheets NW, first to fourth gate electrodes G1, G2, G3 and G4, a gate insulating layer 111, a gate spacer 112, a capping pattern 113, an internal spacer 114, a first insulating structure 120, a second insulating structure 130, a gate-cut GC, a source/drain region 140, a silicide layer 145, a first interlayer insulating layer 150, an etching stop layer 155, a gate contact 160, a source/drain contact 165, a second interlayer insulating layer 170, a first via 181, and a second via 182.

The substrate 100 may be a silicon substrate or an SOI (silicon-on-insulator). In contrast, although the substrate 100 may include silicon germanium, SGOI (silicon germanium on insulator), indium antimonide, lead tellurium compounds, indium arsenic, indium phosphide, gallium arsenide and/or gallium antimonide, the present disclosure is not limited thereto.

Each of the first to third active patterns F1, F2 and F3 may protrude from the substrate 100 in a vertical direction DR3. A first active pattern F1 may extend in a first horizontal direction DR1. A second active pattern F2 may be spaced apart from the first active pattern F1 in a second horizontal direction DR2 that is different from the first horizontal direction DR1. The second active pattern F2 may extend in the first horizontal direction DR1. A third active pattern F3 may be spaced apart from the second active pattern F2 in the second horizontal direction DR2. The third active pattern F3 may extend in the first horizontal direction DR1.

For example, a pitch P1 in the second horizontal direction DR2 between the first active pattern F1 and the second active pattern F2 may be smaller than or less than a pitch P2 in the second horizontal direction DR2 between the second active pattern F2 and the third active pattern F3. As used herein, the term pitch refers to a distance either center-to-center distance between elements or a distance between closes points of elements.

Each of the first to third active patterns F1, F2 and F3 may be a part of the substrate 100, and may include an epitaxial layer that is grown from the substrate 100. Each of the first to third active patterns F1, F2 and F3 may include, for example, silicon or germanium, which is an elemental semiconductor material. Further, each of the first to third active patterns F1, F2 and F3 may include a compound semiconductor, and may include, for example, a group IV-IV compound semiconductor or a group III-V compound semiconductor.

The group IV-IV compound semiconductor may include, for example, a binary compound or a ternary compound containing at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and/or antimony (Sb) as a group V element.

The field insulating layer 105 may be disposed on the substrate 100. The field insulating layer 105 may surround or overlap the side walls of each of the first to third active patterns F1, F2 and F3. Each of the first to third active patterns F1, F2 and F3 may protrude from an upper surface of the field insulating layer 105 in the vertical direction DR3. The field insulating layer 105 may include, for example, an oxide film, a nitride film, an oxynitride film, or a combined film thereof.

A plurality of nanosheets NW may be disposed on each of the first to third active patterns F1, F2 and F3. The plurality of nanosheets NW may include a plurality of nanosheets that are spaced apart from each other and stacked in the vertical direction DR3. The plurality of nanosheets NW may be disposed in a portion in which each of the first to third active patterns F1, F2 and F3 intersects each of the first to fourth gate electrodes G1, G2, G3 and G4.

The plurality of nanosheets NW may be spaced apart from each other in the first horizontal direction DR1 or the second horizontal direction DR2. For example, the plurality of nanosheets NW disposed in the intersecting portion between the first active pattern F1 and the second gate electrode G2 may be spaced apart from the plurality of nanosheets NW disposed in the intersecting portion between the first active pattern F1 and the first gate electrode G1 in the first horizontal direction DR1.

Although FIGS. 3 and 4 show that a plurality of nanosheets NW include three nanosheets spaced apart from each other and stacked in the vertical direction DR3, this is merely for convenience of explanation, and the present disclosure is not limited thereto. In some embodiments, the plurality of nanosheets NW may include four or more nanosheets spaced apart from each other and stacked in the vertical direction DR3.

Each of the first to fourth gate electrodes G1, G2, G3 and G4 may extend in the second horizontal direction DR2 on the field insulating layer 105, the first active pattern F1, the second active pattern F2, and the third active pattern F3. Each of the first to fourth gate electrodes G1, G2, G3 and G4 may intersect each of the first active pattern F1, the second active pattern F2 and the third active pattern F3.

Each of the first to fourth gate electrodes G1, G2, G3 and G4 may be sequentially spaced apart from each other in the first horizontal direction DR1. Specifically, the second gate electrode G2 may be spaced apart from the first gate electrode G1 in the first horizontal direction DR1. The third gate electrode G3 may be spaced apart from the second gate electrode G2 in the first horizontal direction DR1. The fourth gate electrode G4 may be spaced apart from the third gate electrode G3 in the first horizontal direction DR1.

Each of the first to fourth gate electrodes G1, G2, G3 and G4 may surround the plurality of nanosheets NW. Each of the first to fourth gate electrodes G1, G2, G3 and G4 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and/or combinations thereof. Each of the first to fourth gate electrodes G1, G2, G3 and G4 may include a conductive metal oxide, a conductive metal oxynitride, and the like, and/or may also include an oxidized form of the above-mentioned materials.

A first trench T1 may be formed on a first side F2_s1 of the second active pattern F2. That is, the first trench T1 may be formed between the second active pattern F2 and the first active pattern F1. The first trench T1 may extend in the first horizontal direction DR1. The first trench T1 may extend into the field insulating layer 105.

The first insulating structure 120 may be disposed inside the first trench T1. That is, the first insulating structure 120 may be disposed between the second active pattern F2 and the first active pattern F1. The first insulating structure 120 may extend in the first horizontal direction DR1. For example, the first insulating structure 120 may intersect each of the first to fourth gate electrodes G1, G2, G3 and G4. At least a part of the first insulating structure 120 may be disposed inside the field insulating layer 105.

The first insulating structure 120 may include, for example, at least one of silicon nitride (SiN), silicon oxynitride (SiON), silicon carbonitride (SiCN), silicon oxycarbonitride (SiOCN), silicon carbide (SiC) and/or combinations thereof. In some embodiments, the first insulating structure 120 may include at least one of high dielectric constant materials having a higher dielectric constant than the silicon oxide ($SiO_2$). The high dielectric constant materials may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

A second trench T2 may be formed on a second side F2_s2 of the second active pattern F2 that is opposite to the first side F2_s1 of the second active pattern F2 in the second horizontal direction DR2. That is, the second trench T2 may be formed between the second active pattern F2 and the third active pattern F3. The second trench T2 may extend in the first horizontal direction DR1. The second trench T2 may extend into the field insulating layer 105.

The second insulating structure 130 may be disposed inside the second trench T2. That is, the second insulating structure 130 may be disposed between the second active pattern F2 and the third active pattern F3. The second insulating structure 130 may extend in the first horizontal direction DR1. For example, the second insulating structure 130 may intersect each of the first to fourth gate electrodes G1, G2, G3 and G4. At least a part of the second insulating structure 130 may be disposed inside the field insulating layer 105. A width W1 of an upper surface 120a of the first insulating structure 120 in the second horizontal direction DR2 may be smaller than a width W2 of upper surfaces 131a and 132a of the second insulating structure 130 in the second horizontal direction DR2.

The second insulating structure 130 may include a first insulating layer 131 and a second insulating layer 132. The first insulating layer 131 may be disposed along the side walls and a bottom surface of the second trench T2. For example, the first insulating layer 131 may be conformally disposed. An upper surface 131a of the first insulating layer 131 may be formed on the same plane as the upper surface 120a of the first insulating structure 120.

The first insulating layer 131 may include the same material as the first insulating structure 120. The first insulating layer 131 may include, for example, one of silicon nitride (SiN), silicon oxynitride (SiON), silicon carbonitride (SiCN), silicon oxycarbonitride (SiOCN), silicon carbide (SiC), a high dielectric constant material and/or combinations thereof.

The second insulating layer 132 may fill or at least partially fill the inside of the second trench T2 on the first insulating layer 131. For example, the second insulating layer 132 may completely fill the inside of the second trench T2. An upper surface 132a of the second insulating layer 132 may be formed on the same plane as the upper surface 131a of the first insulating layer 131. Further, the upper surface 132a of the second insulating layer 132 may be formed on the same plane as the upper surface 120a of the first insulating structure 120. The second insulating layer 132 may include a material different from that of the first insulating layer 131. The second insulating layer 132 may include, for example, a silicon oxide (SiO$_2$). However, the present disclosure is not limited thereto.

The gate-cut GC may extend in the first horizontal direction DR1 between the first active pattern F1 and the second active pattern F2. The gate-cut GC may be disposed on the first insulating structure 120. Although FIGS. 1 to 3 show that the gate-cut GC is not disposed on the second insulating structure 130, the present disclosure is not limited thereto. In some embodiments, the gate-cut GC may also be disposed on each of the first insulating structure 120 and the second insulating structure 130.

For example, a width of a lower surface of gate-cut GC in the second horizontal direction DR2 may be the same as the width W1 of the upper surface 120a of the first insulating structure 120 in the second horizontal direction DR2. For example, the lower surface of the gate-cut GC may completely overlap the upper surface 120a of the first insulating structure 120 in the vertical direction DR3. However, the present disclosure is not limited thereto.

The gate-cut GC may include, for example, at least one of silicon nitride (SiN), silicon oxide (SiO$_2$), silicon oxynitride (SiON), silicon carbonitride (SiCN), silicon oxycarbonitride (SiOCN), silicon carbide (SiC) and/or combinations thereof. Each of the first to fourth gate electrodes G1, G2, G3 and G4 may be separated by the first insulating structure 120 and/or the gate-cut GC.

The source/drain region 140 may be disposed on at least one side of each of the first to fourth gate electrodes G1, G2, G3 and G4 on each of the first to third active patterns F1, F2 and F3. The source/drain region 140 may be in contact with a plurality of nanosheets NW. Although FIG. 4 shows that the upper surface of the source/drain region 140 is formed to be higher than the upper surface of the uppermost nanosheet of the plurality of nanosheets NW, the present disclosure is not limited thereto.

The gate spacer 112 may extend in the second horizontal direction DR2 along the side walls of each of the first to fourth gate electrodes G1, G2, G3 and G4 on the uppermost nanosheet of the plurality of nanosheets NW. Each of the first to fourth gate electrodes G1, G2, G3 and G4 may be disposed inside a gate trench defined by a gate spacer 112 on the uppermost nanosheet of the plurality of nanosheets NW.

Further, the gate spacer 112 may extend in the second horizontal direction DR2 along the side walls of each of the first to fourth gate electrodes G1, G2, G3 and G4 on the field insulating layer 105. Each of the first to fourth gate electrodes G1, G2, G3 and G4 may be disposed inside the gate trench defined by the gate spacer 112 on the field insulating layer 105.

The gate spacer 112 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and/or combinations thereof.

The internal spacer 114 may be disposed on both sides of each of the first to fourth gate electrodes G1, G2, G3 and G4 between the plurality of nanosheets NW. Further, the internal spacer 114 may be disposed on both sides of each of the first to fourth gate electrodes G1, G2, G3 and G4, between each of the first to third active patterns F1, F2 and F3 and the lowermost nanosheet of the plurality of nanosheets NW. The internal spacer 114 may be disposed between the source/drain region 140 and each of the first to fourth gate electrodes G1, G2, G3 and G4. In some embodiments, the internal spacer 114 may be omitted.

The internal spacer 114 may be in contact with the source/drain region 140. Although FIG. 4 shows that the side walls of the internal spacer 114 being in contact with the source/drain region 140 are aligned with the side walls of the plurality of nanosheet NW in the vertical direction DR3, the present disclosure is not limited thereto.

The internal spacer 114 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and/or combinations thereof. However, the present disclosure is not limited thereto.

The gate insulating layer 111 may be disposed between each of the first to fourth gate electrodes G1, G2, G3 and G4 and a plurality of nanosheets NW. The gate insulating layer 111 may be disposed between the first to fourth gate electrodes G1, G2, G3 and G4 and the gate spacer 112. The gate insulating layer 111 may be disposed between the first to fourth gate electrodes G1, G2, G3 and G4 and the internal spacer 114. The gate insulating layer 111 may be disposed between the first to fourth gate electrodes G1, G2, G3 and G4 and the first to third active patterns F1, F2 and F3. The gate insulating layer 111 may be disposed between the first to fourth gate electrodes G1, G2, G3 and G4 and the field insulating layer 105.

Further, the gate insulating layer 111 may be disposed between each of the first to fourth gate electrodes G1, G2, G3 and G4 and the first insulating structure 120. The gate insulating layer 111 may be disposed between the first to fourth gate electrodes G1, G2, G3 and G4 and the second insulating structure 130. The gate insulating layer 111 may be disposed between the first to fourth gate electrodes G1, G2, G3 and G4 and the gate-cut GC. The gate insulating layer 111 may be in contact with the upper surface 120a of the first insulating structure 120, the upper surface 131a of the first insulating layer 131, and the upper surface 132a of the second insulating layer 132.

The gate insulating layer 111 may include at least one of silicon oxide, silicon oxynitride, silicon nitride or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

A semiconductor device according to some embodiments may include an NC (Negative Capacitance) FET that uses a negative capacitor. For example, the gate insulating layer 111 may include a ferroelectric material film having ferroelectric properties, and a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and/or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, a silicon oxide and/or a metal oxide having a high dielectric constant. The metal oxide included in the paraelectric material film may include, for example, but is not limited to, at least one of hafnium oxide, zirconium oxide, and/or aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, but is not limited to, for example, 0.5 to 10 nm. Since a critical thickness that exhibits the ferroelectric properties may vary for each ferroelectric material, the thickness of the ferroelectric material film may vary depending on the ferroelectric material.

As an example, the gate insulating layer 111 may include one ferroelectric material film. As another example, the gate insulating layer 111 may include a plurality of ferroelectric material films spaced apart from each other. The gate insulating layer 111 may have a stacked film structure in which a plurality of ferroelectric material films and a plurality of paraelectric material films are alternately stacked.

The capping pattern 113 may be disposed on each of the first to fourth gate electrodes G1, G2, G3 and G4. The capping pattern 113 may surround or overlap the side walls of the gate-cut GC. For example, the upper surface of the capping pattern 113 may be formed on the same plane as the upper surface of the gate-cut GC.

The capping pattern 113 may include, for example, at least one of silicon nitride (SiN), silicon oxynitride (SiON), silicon oxide ($SiO_2$), silicon carbonitride (SiCN), silicon oxycarbonitride (SiOCN), and/or combinations thereof.

The first interlayer insulating layer 150 may be disposed to cover or be on the gate spacer 112, the field insulating layer 105 and/or the source/drain region 140. The first interlayer insulating layer 150 may include, for example, at least one of silicon oxide, silicon nitride, silicon oxynitride, and/or a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica and/or combinations thereof. However, the present disclosure is not limited thereto.

The gate contact 160 penetrates the first interlayer insulating layer 150 and the capping pattern 113 in the vertical direction DR3, and may be connected to at least one of the first to fourth gate electrodes G1, G2, G3 and G4. Although FIG. 3 shows that the gate contact 160 is formed of a single layer, this is merely for convenience of explanation, and the present disclosure is not limited thereto. That is, the gate contact 160 may be formed of multi-layers. The gate contact 160 may include a conductive material.

The source/drain contact 165 may penetrate the first interlayer insulating layer 150 in the vertical direction and be electrically connected to the source/drain region 140. The source/drain contact 165 may extend into the source/drain region 140. Although FIG. 4 shows that the source/drain contact 165 is formed of a single layer, this is merely for convenience of explanation, and the present disclosure is not limited thereto. That is, the source/drain contact 165 may be formed of multi-layers. The source/drain contact 165 may include a conductive material.

The silicide layer 145 may be disposed between the source/drain region 140 and the source/drain contact 165. The silicide layer 145 may include, for example, a metal silicide material.

The etching stop layer 155 may be disposed on the first interlayer insulating layer 150. The etching stop layer 155 may cover or be on a part of the upper surface of the gate contact 160. Although FIGS. 3 and 4 show that the etching stop layer 155 is formed of a single layer, the present disclosure is not limited thereto. In some embodiments, the etching stop layer 155 may be formed of multi-layers. The etching stop layer 155 may include, for example, at least one of silicon oxide, silicon nitride, silicon oxynitride, and a low dielectric constant material.

The second interlayer insulating layer 170 may be disposed on the etching stop layer 155. The second interlayer insulating layer 170 may include, for example, at least one of silicon oxide, silicon nitride, silicon oxynitride, and/or a low dielectric constant material.

The first via 181 may penetrate the second interlayer insulating layer 170 and the etching stop layer 155 in the vertical direction DR3 and be connected to the gate contact 160. Although FIG. 3 shows that the first via 181 is formed of a single layer, this is merely for convenience of explanation, and the present disclosure is not limited thereto. That is, the first via 181 may be formed of multi-layers. The first via 181 may include a conductive material.

The second via 182 may penetrate the second interlayer insulating layer 170 and the etching stop layer 155 in the vertical direction DR3, and be connected to the source/drain contact 165. Although FIG. 4 shows that the second via 182 is formed of a single layer, this is for convenience of explanation, and the present disclosure is not limited thereto. That is, the second via 182 may be formed of multi-layers. The second via 182 may include a conductive material.

Hereinafter, a method for manufacturing the semiconductor device shown in FIGS. 1 to 4 will be described referring to FIGS. 5 to 17.

FIGS. 5 to 17 are intermediate stage diagrams for explaining the method for manufacturing the semiconductor device according to some embodiments of the present disclosure.

Figure 5:
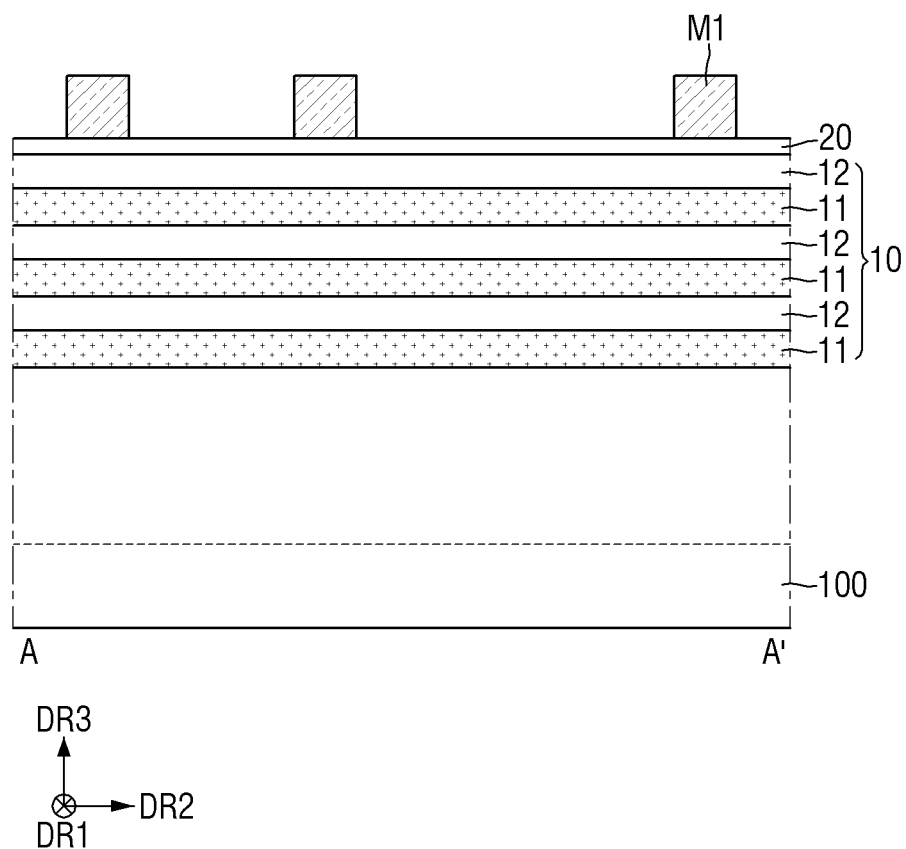
FIGS. 5 to 17 are intermediate stage diagrams for explaining a method for manufacturing a semiconductor device according to some embodiments of the present disclosure.

Referring to FIG. 5, a stacked structure 10 in which the first semiconductor layer 11 and the second semiconductor layer 12 are alternately stacked may be formed on the substrate 100. For example, the first semiconductor layer 11 may be formed at the lowermost part of the stacked structure 10, and the second semiconductor layer 12 may be formed at the uppermost part of the stacked structure 10. However, the present disclosure is not limited thereto. The first semiconductor layer 11 may include, for example, silicon germanium (SiGe). The second semiconductor layer 12 may include, for example, silicon (Si).

Subsequently, a pad insulating layer 20 may be formed on the stacked structure 10. Although the pad insulating layer 20 may include, for example, silicon oxide ($SiO_2$), the present disclosure is not limited thereto. Subsequently, a first mask pattern M1 may be formed on the pad insulating layer 20.

Figure 6:
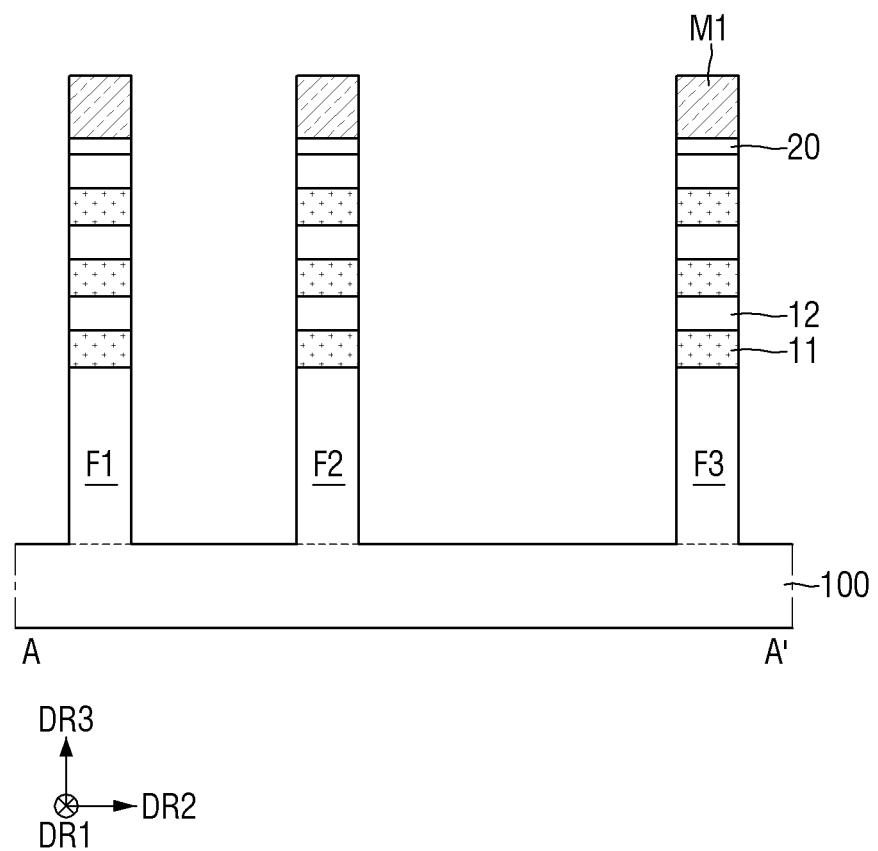

Referring to FIG. 6, a part of the pad insulating layer 20, the stacked structure 10 and the substrate 100 may be etched, using the first mask pattern M1 as a mask. The first to third active patterns F1, F2 and F3 may be formed on the substrate 100 through the etching process. Each of the first to third active patterns F1, F2 and F3 may extend in the first horizontal direction DR1.

Figure 7:
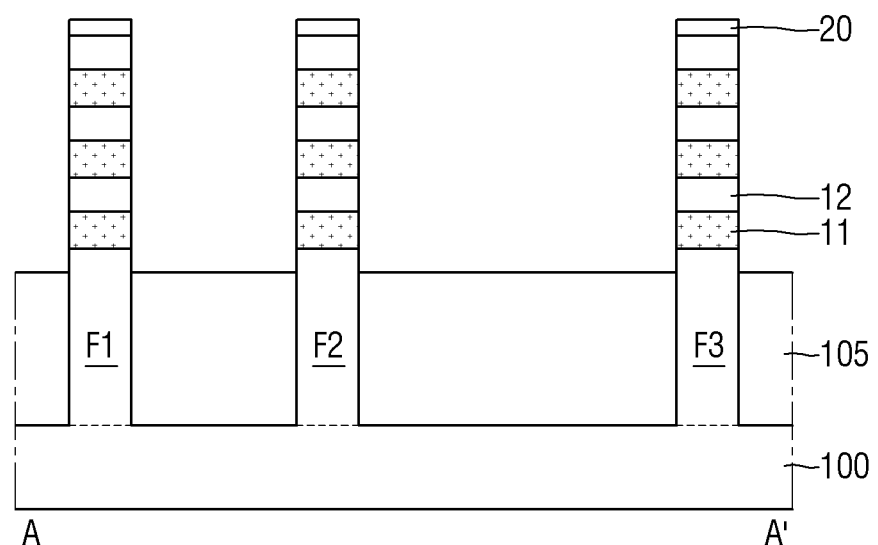

Referring to FIG. 7, the field insulating layer 105 may be formed on the substrate 100. The field insulating layer 105 may surround or overlap the side walls of each of the first to third active patterns F1, F2 and F3. The upper surface of the field insulating layer 105 may be formed to be lower than the upper surfaces of each of the first to third active patterns F1, F2 and F3. Subsequently, the first mask pattern M1 may be removed.

Figure 8:
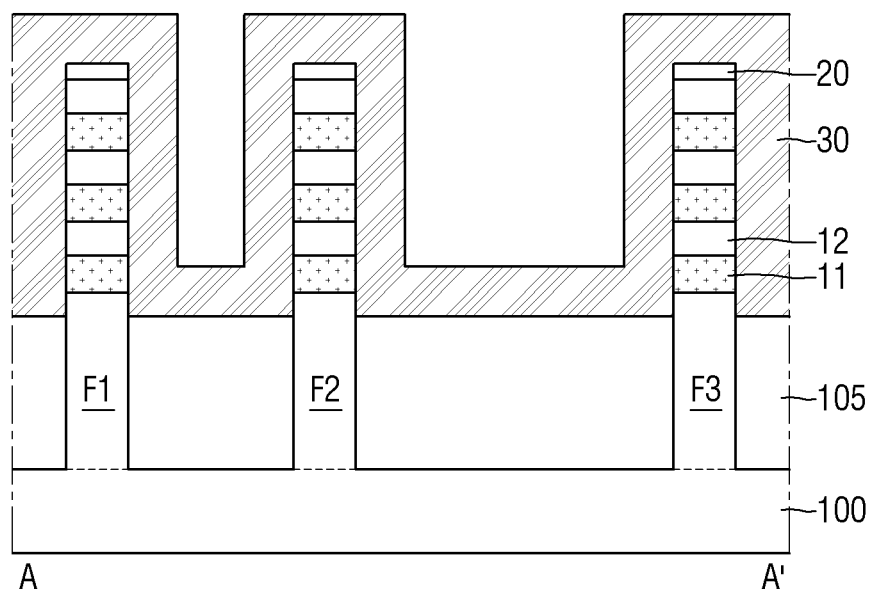

Referring to FIG. 8, a dummy gate liner layer 30 may be formed on the upper surface of the exposed field insulating layer 105, the side walls of each of the first to third active patterns F1, F2 and F3 exposed on the field insulating layer 105, the side walls of the first semiconductor layer 11, the side walls of the second semiconductor layer 12, and the pad insulating layer 20. For example, the dummy gate liner layer 30 may be conformally formed. The dummy gate liner layer 30 may include, for example, polysilicon. However, the present disclosure is not limited thereto.

Figure 9:
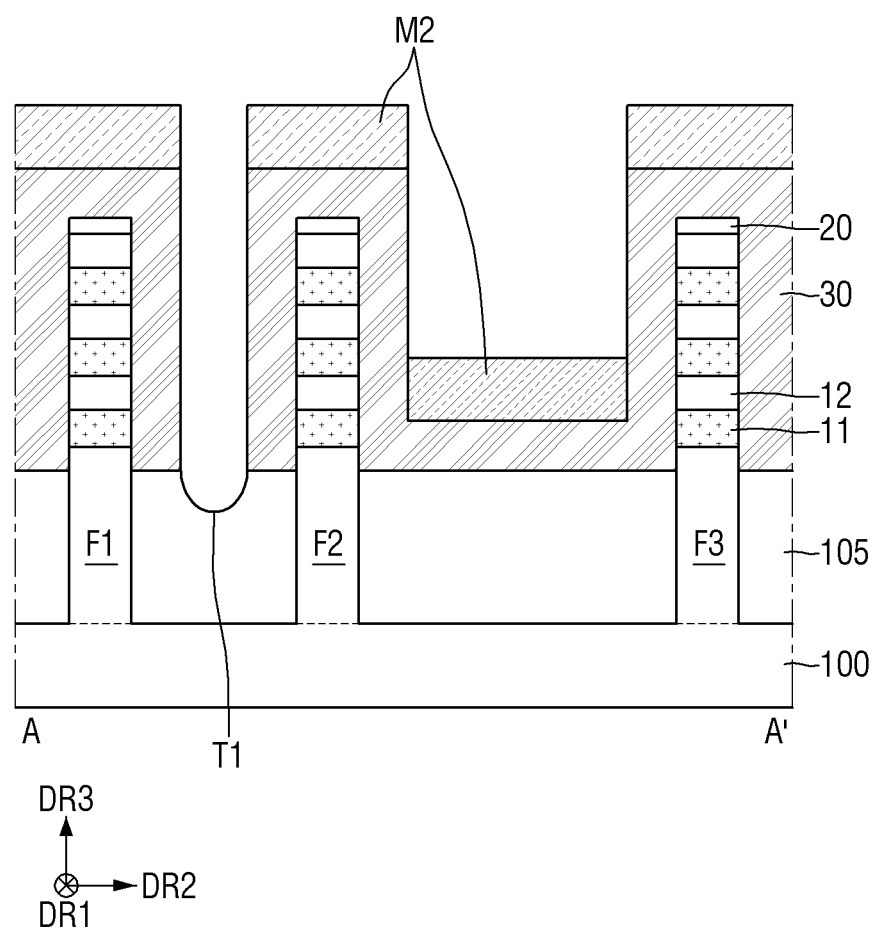

Referring to FIG. 9, a second mask pattern M2 may be formed on the dummy gate liner layer 30. The second mask pattern M2 may be formed on the uppermost surface of the dummy gate liner layer 30 formed on the upper parts of each of the first to third active patterns F1, F2 and F3. Further, the second mask pattern M2 may be formed on the dummy gate liner layer 30 formed along the upper surface of the field insulating layer 105 between the second active pattern F2 and the third active pattern F3. However, the second mask pattern M2 is not formed on the dummy gate liner layer 30 formed along the upper surface of the field insulating layer 105 between the first active pattern F1 and the second active pattern F2.

Subsequently, a part of the dummy gate liner layer 30 formed along the upper surface of the field insulating layer 105 may be etched between the first active pattern F1 and the second active pattern F2, using the second mask pattern M2 as a mask. In this case, a part of the field insulating layer 105 between the first active pattern F1 and the second active pattern F2 may also be etched. A first trench T1 extending into the field insulating layer 105 may be formed between the first active pattern F1 and the second active pattern F2 through such an etching process.

Figure 10:
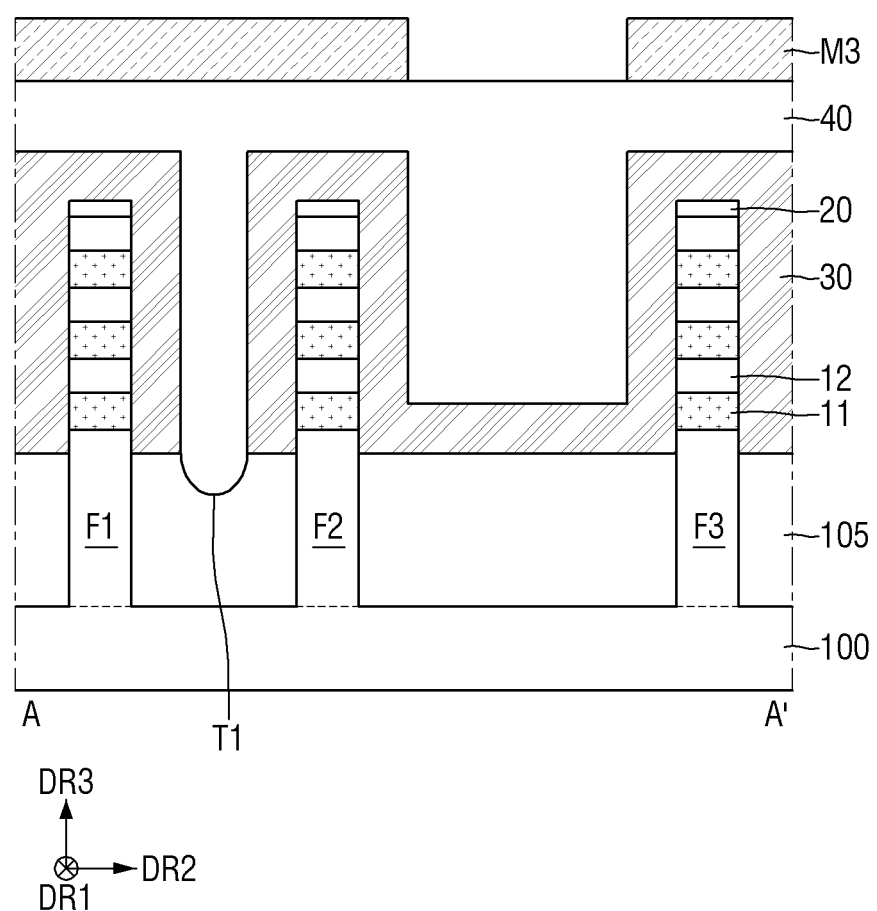

Referring to FIG. 10, after the second mask pattern M2 is removed, a protective layer 40 may be formed on the dummy gate liner layer 30. The protective layer 40 may fill the inside of the first trench T1. The protective layer 40 may include, for example, SOH.

Subsequently, a third mask pattern M3 may be formed on the protective layer 40. The third mask pattern M3 may expose the protective layer 40 formed between the second active pattern F2 and the third active pattern F3.

Figure 11:
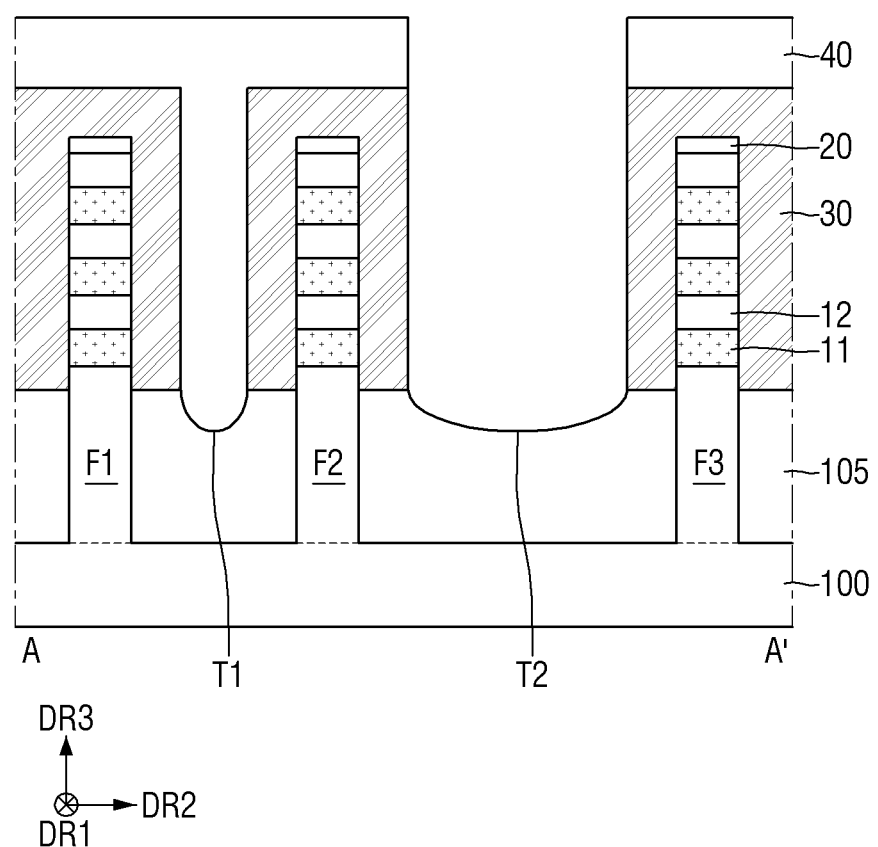

Referring to FIG. 11, a part of the protective layer 40, the dummy gate liner layer 30 and the field insulating layer 105 exposed between the second active pattern F2 and the third active pattern F3 may be etched, using the third mask pattern M3 as a mask. A second trench T2 extending into the field insulating layer 105 may be formed between the second active pattern F2 and the third active pattern F3 through an etching process. Subsequently, the third mask pattern M3 may be removed.

Figure 12:
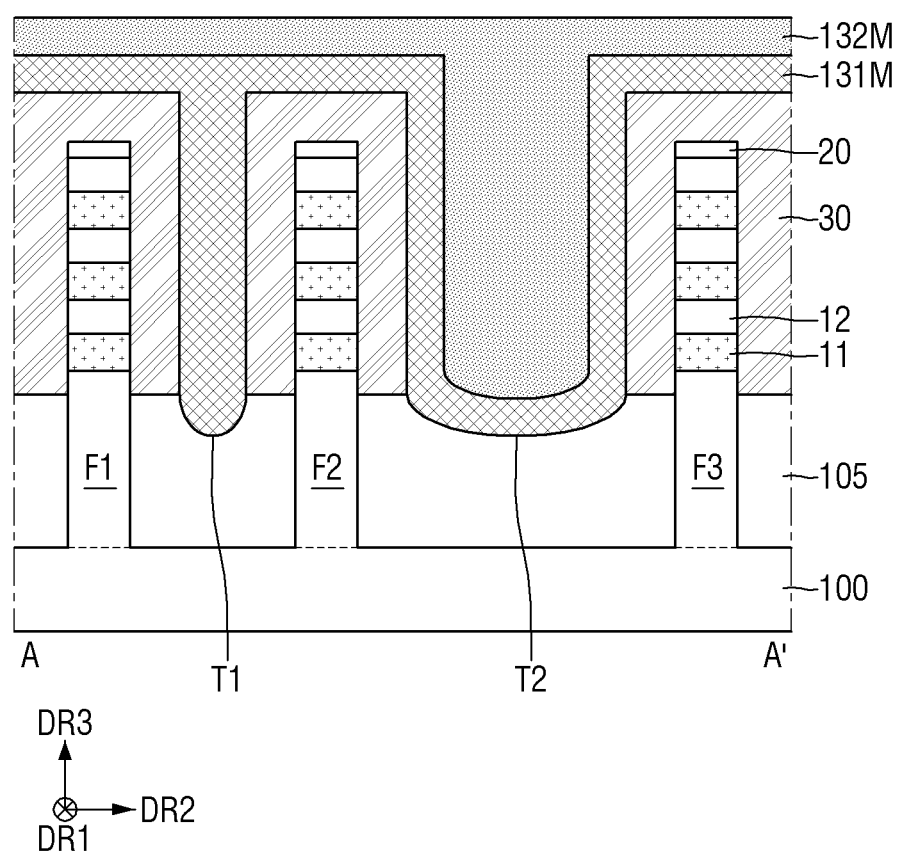

Referring to FIG. 12, a first insulating material layer 131M may be formed on the dummy gate liner layer 30 after the protective layer 40 is removed. For example, the first insulating material layer 131M may be conformally formed. The first insulating material layer 131M may completely fill the first trench T1. The first insulating material layer 131M may be formed along the side walls and bottom surface of the second trench T2. The first insulating material layer 131M may include, for example, at least one of silicon nitride (SiN), silicon oxynitride (SiON), silicon carbonitride (SiCN), silicon oxycarbonitride (SiOCN), silicon carbide (SiC), a high dielectric constant material and/or combinations thereof.

Subsequently, a second insulating material layer 132M may be formed on the first insulating material layer 131M. The second insulating material layer 132M may completely fill or at least partially fill the second trench T2 on the first insulating material layer 131M. The second insulating material layer 132M may include, for example, a silicon oxide ($SiO_2$). However, the present disclosure is not limited thereto.

Figure 13:
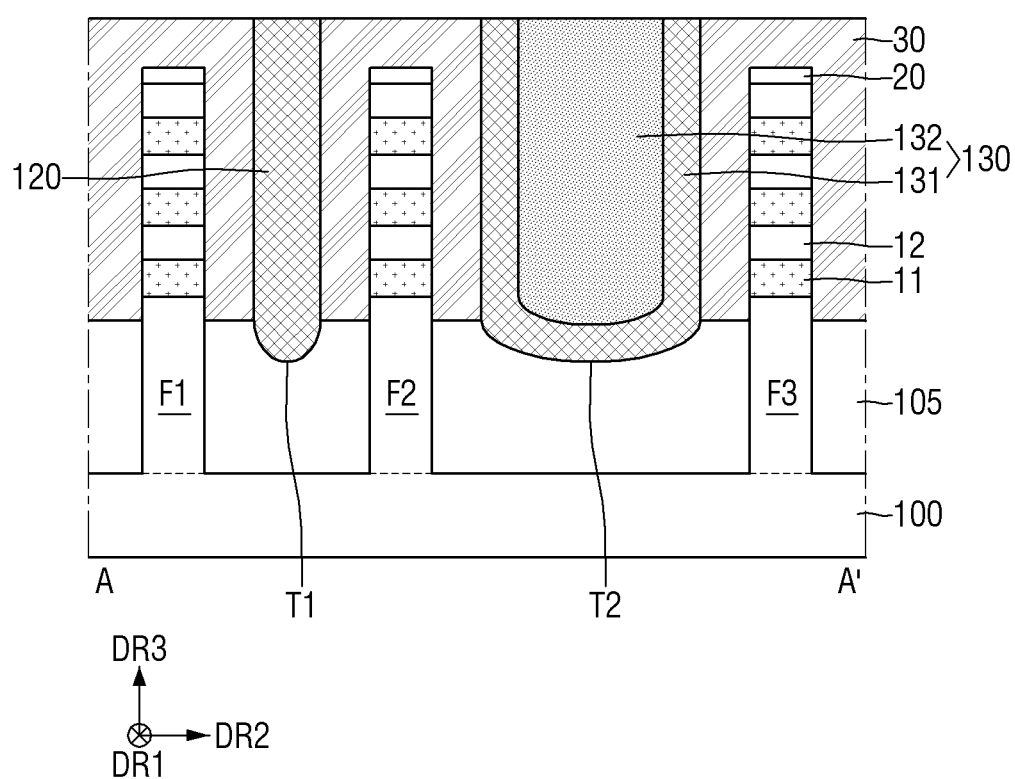

Referring to FIG. 13, a part of the first insulating material layer 131M and a part of the second insulating material layer 132M of FIG. 12 may be etched through a flattening process (e.g., a CMP process). The uppermost surface of the dummy gate liner layer 30 may be exposed through the flattening process. The first insulating structure 120 may be formed inside the first trench T1 through the flattening process. Further, the second insulating structure 130 may be formed inside the second trench T2 through the flattening process.

Figure 14:
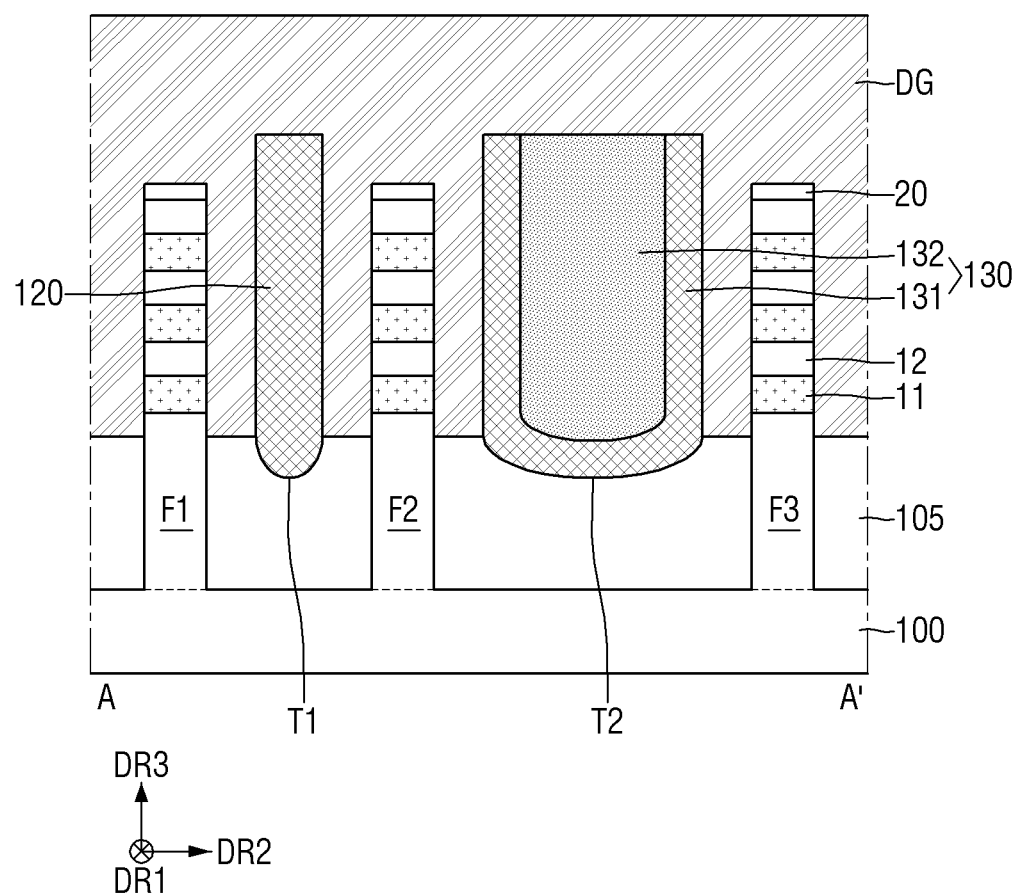

Referring to FIG. 14, a layer including the same material as the dummy gate liner layer 30 may be formed on the uppermost surface of the dummy gate liner layer 30, the upper surface of the first insulating structure 120 and the upper surface of the second insulating structure 130. A dummy gate DG including the dummy gate liner layer 30 may be formed accordingly. Subsequently, although not shown in FIG. 14, a first interlayer insulating layer (150 of FIGS. 3 and 4) may be formed to cover or overlap the side walls of the dummy gate DG.

Figure 15:
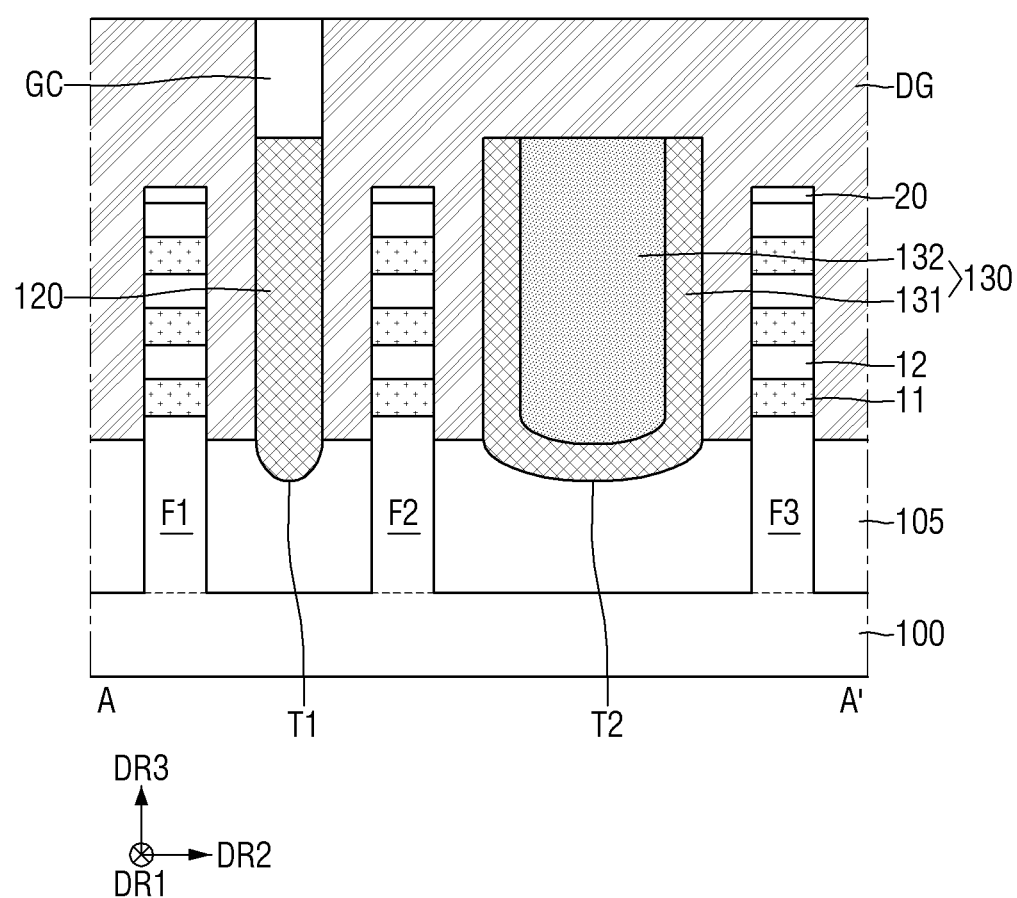

Referring to FIG. 15, the dummy gate DG formed on the first insulating structure 120 may be etched. Subsequently, the gate-cut GC may be formed in the portion in which the dummy gate DG is etched.

Figure 16:
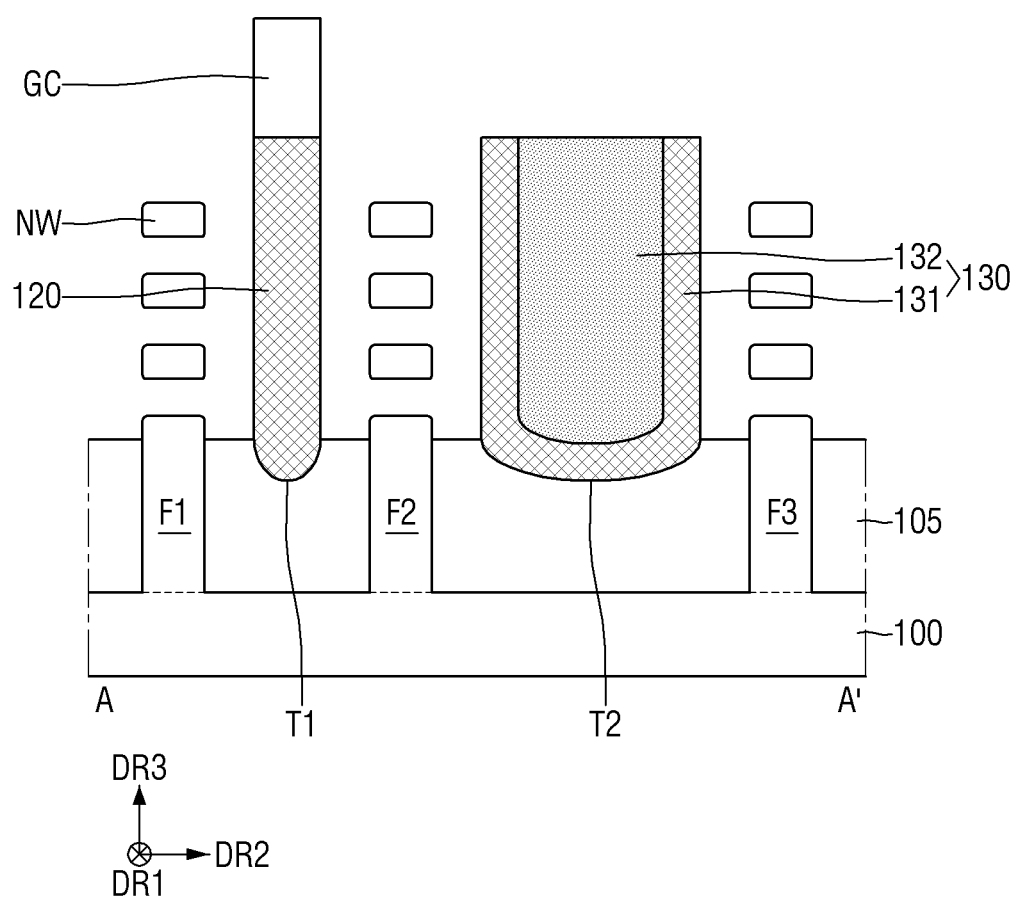

Referring to FIG. 16, the dummy gate DG, the pad insulating layer 20, and the first semiconductor layer 11 may be removed.

Figure 17:
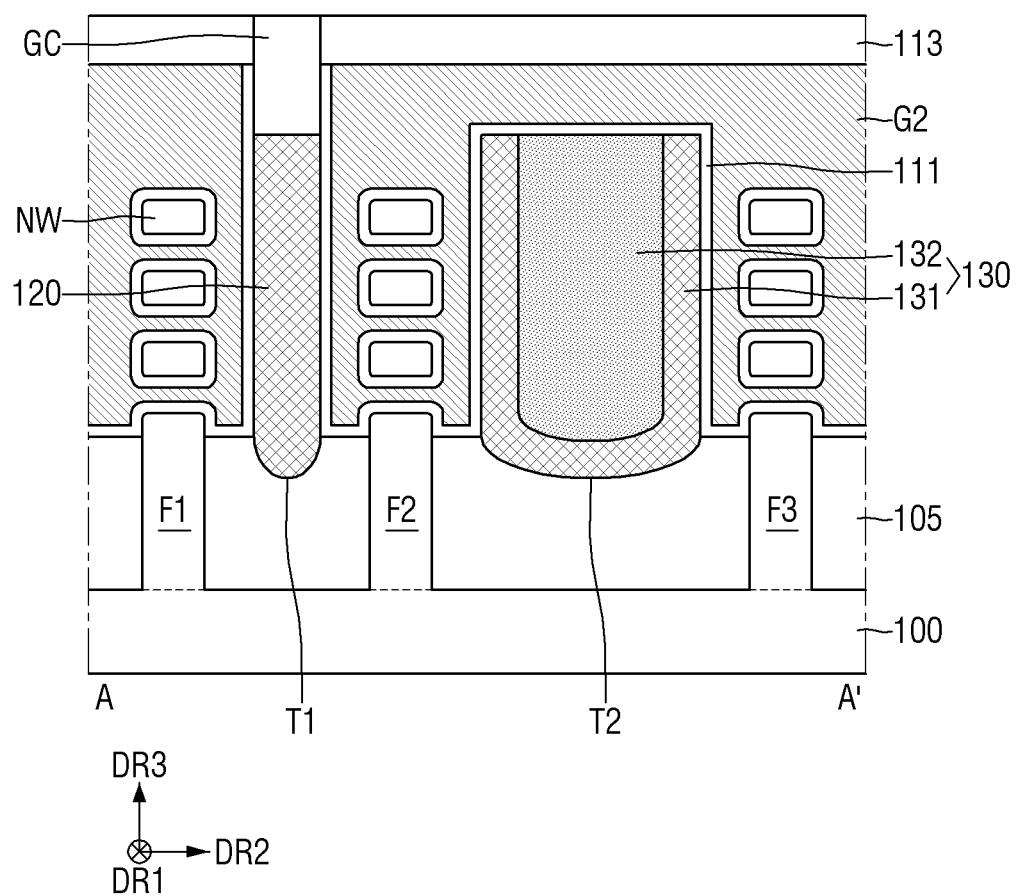

Referring to FIG. 17, the gate insulating layer 111 may be formed along the first to third active patterns F1, F2 and F3 exposed on the field insulating layer 105, the upper surface of the field insulating layer 105, the plurality of nanosheets NW, the side walls of the first insulating structure 120, the side walls and the upper surface of the second insulating structure 130, and the side walls of the gate-cut GC.

Subsequently, the first to fourth gate electrodes G1, G2, G3 and G4 may be formed on the gate insulating layer 111. Subsequently, the capping pattern 113 may be formed on the first to fourth gate electrodes G1, G2, G3 and G4. The capping pattern 113 may surround or overlap the side walls of the gate-cut GC. The capping pattern 113 may be in contact with the gate-cut GC.

Referring to FIGS. 3 and 4, a first interlayer insulating layer 150 may be additionally formed on the capping pattern 113. Subsequently, a gate contact 160 which penetrates the first interlayer insulating layer 150 and the capping pattern 113 in the vertical direction DR3 and is electrically connected to the second gate electrode G2 may be formed. Further, a source/drain contact 165 which penetrates the first interlayer insulating layer 150 in the vertical direction DR3 and is connected to the source/drain region 140 may be formed. A silicide layer 145 may be formed between the source/drain region 140 and the source/drain contact 165.

Subsequently, the etching stop layer 155 and the second interlayer insulating layer 170 may be sequentially formed on the first interlayer insulating layer 150. Subsequently, a first via 181 which penetrates the second interlayer insulating layer 170 and the etching stop layer 155 in the vertical direction DR3 and is connected to the gate contact 160 may be formed. Further, a second via 182 which penetrates the second interlayer insulating layer 170 and the etching stop layer 155 in the vertical direction DR3 and is connected to the source/drain contact 165 may be formed. The semiconductor device shown in FIGS. 1 to 3 may be manufactured through such a process.

In the semiconductor device and the method for manufacturing the semiconductor device according to some embodiments of the present disclosure, the formation depth of the gate-cut GC may be reduced, by forming the first insulating structure 120 below the gate-cut CG. Accordingly, the level of difficulty of the etching process for forming the gate-cut GC may be reduced by securing the margin of the etching process for forming the gate-cut GC.

Hereinafter, the method for manufacturing the semiconductor device shown in FIGS. 1 to 4 will be described referring to FIGS. 18 to 26. Differences from the method for manufacturing the semiconductor device shown in FIGS. 5 to 17 will be mainly described.

FIGS. 18 to 26 are intermediate stage diagrams for explaining a method for manufacturing a semiconductor device according to some embodiments of the present disclosure.

Figure 18:
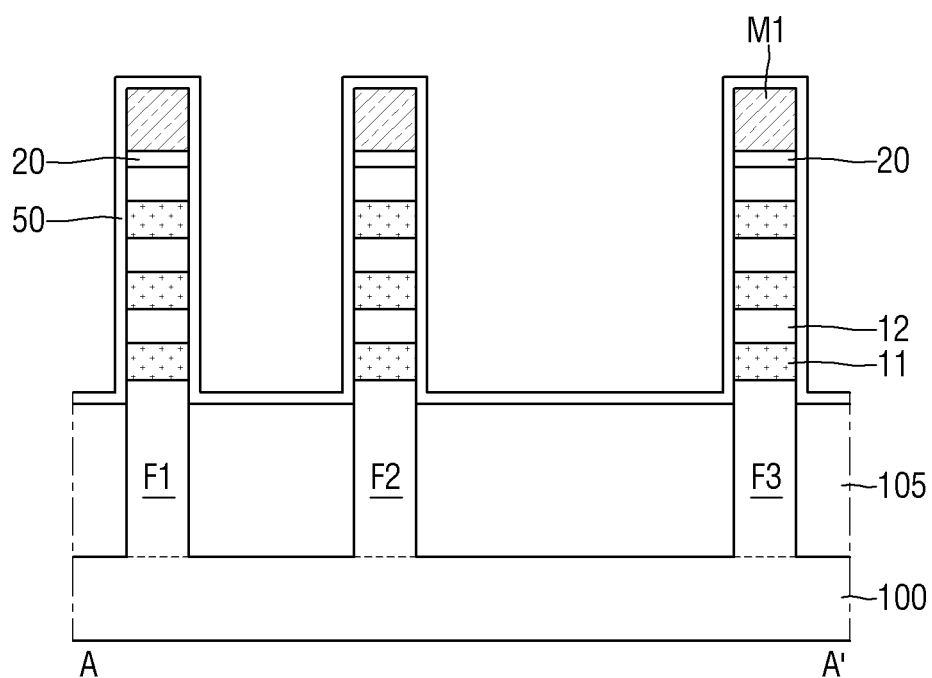
FIGS. 18 to 26 are intermediate stage diagrams for explaining a method for manufacturing a semiconductor device according to some embodiments of the present disclosure.

Referring to FIG. 18, the field insulating layer 105 may be formed on the substrate 100 after the process shown in FIG. 6 is performed. Subsequently, the first liner layer 50 may be formed on the upper surface of the exposed field insulating layer 105, the side walls of each of the first to third active patterns F1, F2 and F3 exposed on the field insulating layer 105, the side walls of the first semiconductor layer 11, the side walls of the second semiconductor layer 12, the side walls of the pad insulating layer 20, and the first mask pattern M1. The first liner layer 50 may be formed, for example, conformally. Although the first liner layer 50 may include, for example, silicon oxide ($SiO_2$), the present disclosure is not limited thereto.

Figure 19:
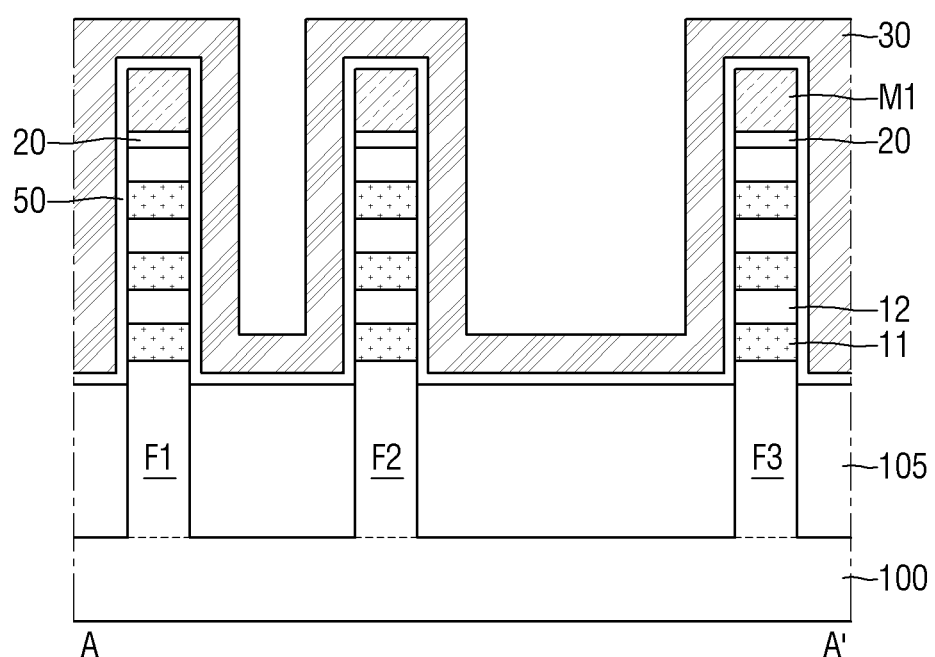
Figure 19:
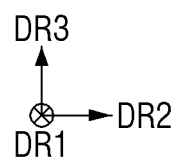

Referring to FIG. 19, a dummy gate liner layer 30 may be formed on the first liner layer 50. For example, the dummy gate liner layer 30 may be formed conformally.

Figure 20:
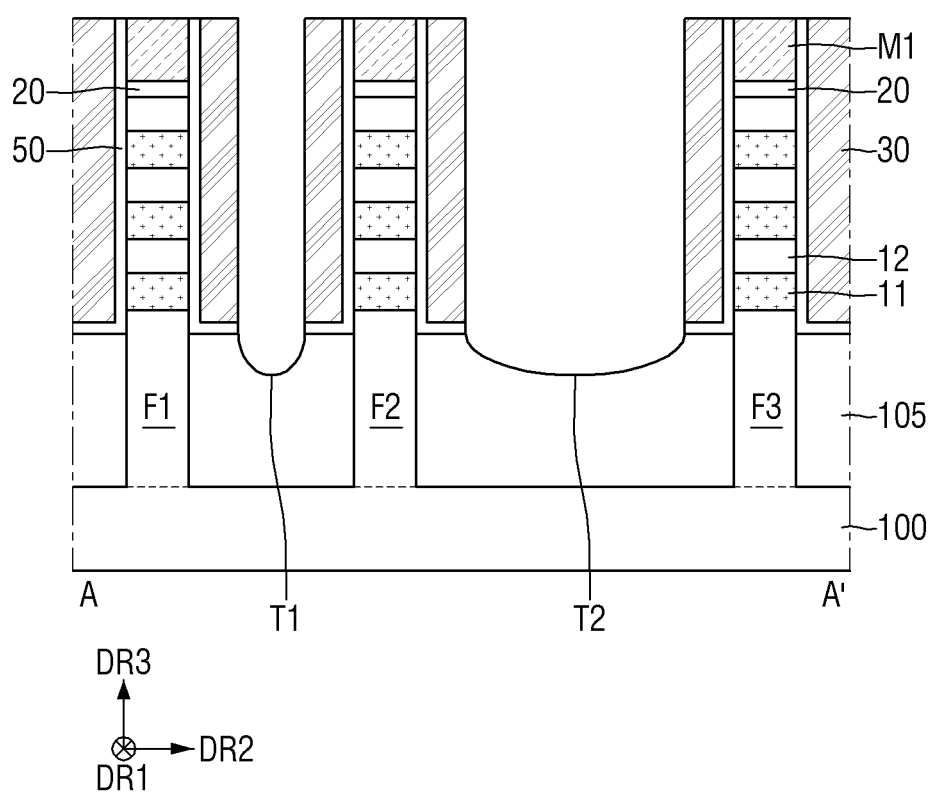

Referring to FIG. 20, a first trench T1 may be formed between the first active pattern F1 and the second active pattern F2 through the etch back etching process. Further, a second trench T2 may be formed between the second active pattern F2 and the third active pattern F3 through the etch back etching process. The first mask pattern M1 may be exposed through the etch back etching process.

Figure 21:
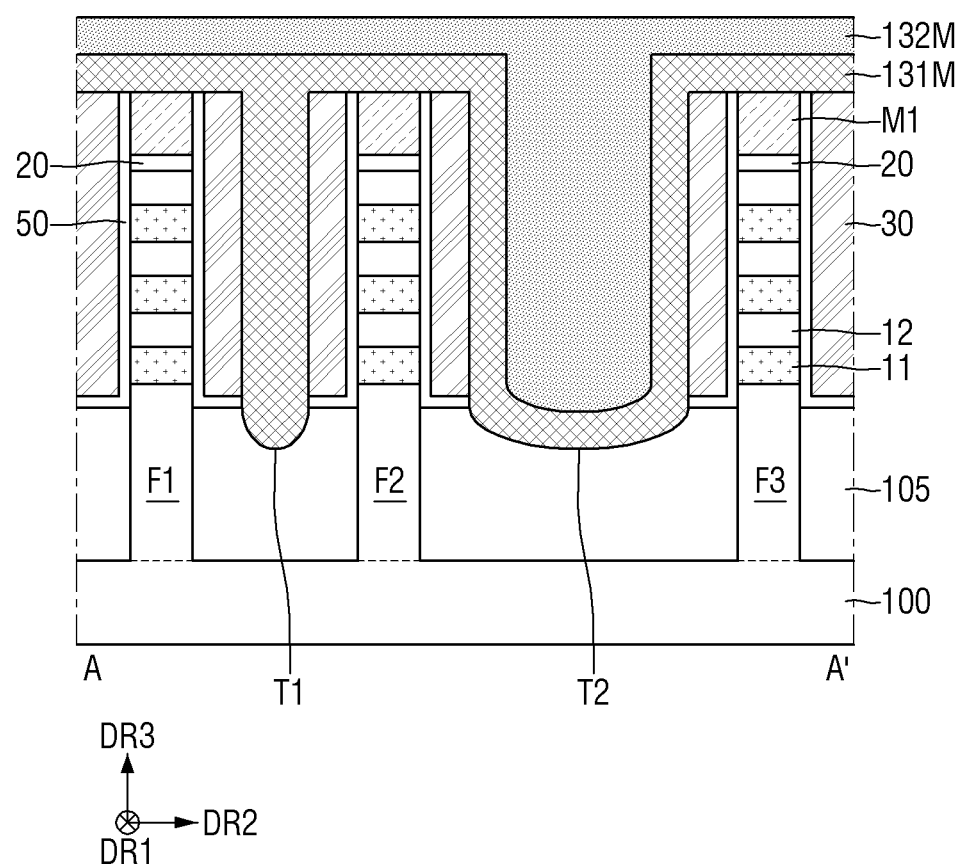

Referring to FIG. 21, the first insulating material layer 131M may be formed on the dummy gate liner layer 30 and the upper surface of the first mask pattern M1. For example, the first insulating material layer 131M may be formed conformally. The first insulating material layer 131M may completely fill or at least partially fill the first trench T1. The first insulating material layer 131M may be formed along the side walls and the bottom surface of the second trench T2.

Subsequently, the second insulating material layer 132M may be formed on the first insulating material layer 131M. The second insulating material layer 132M may completely fill or at least partially fill the second trench T2 on the first insulating material layer 131M.

Figure 22:
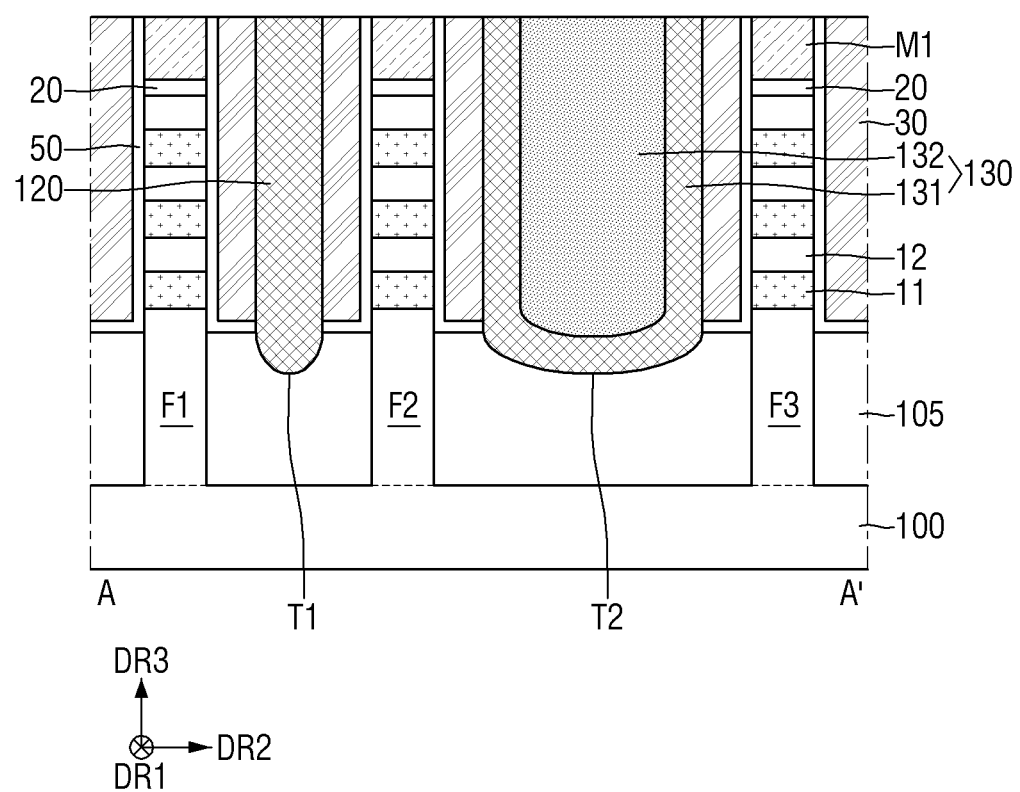

Referring to FIG. 22, a part of the first insulating material layer 131M and a part of the second insulating material layer 132M may be etched through the flattening process. The upper surface of the first mask pattern M1 may be exposed through the flattening process. The first insulating structure 120 may be formed inside the first trench T1 through the flattening process. Further, the second insulating structure 130 may be formed inside the second trench T2 through the flattening process.

Figure 23:
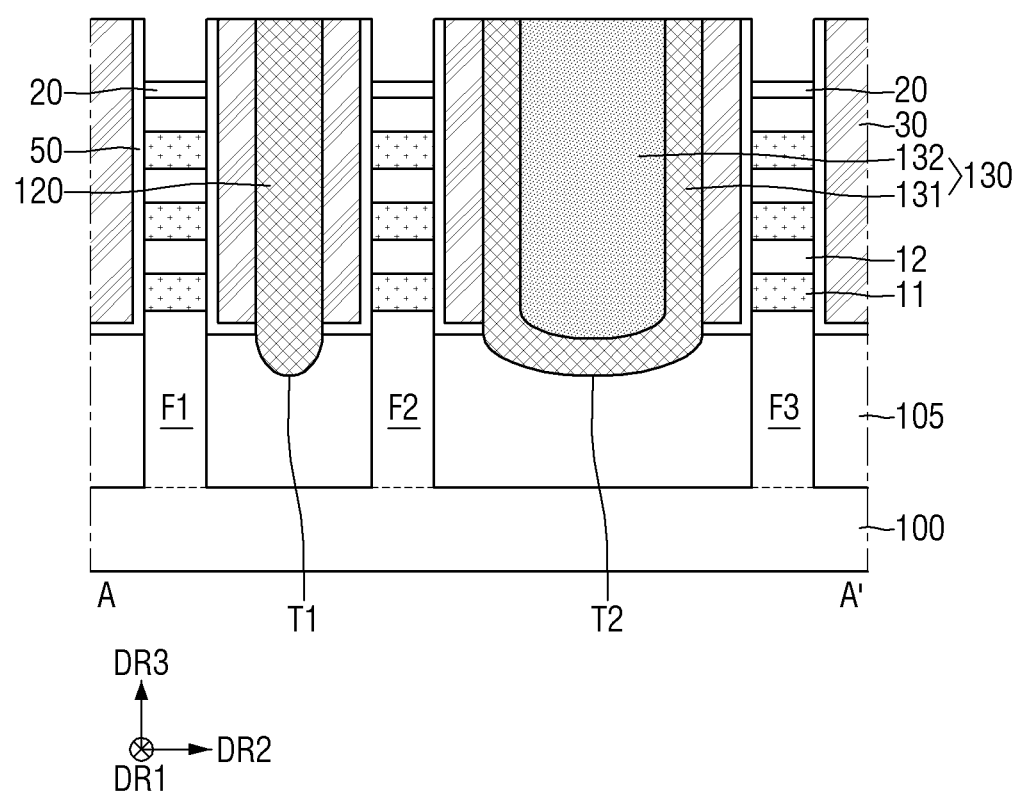

Referring to FIG. 23, the first mask pattern M1 may be removed.

Figure 24:
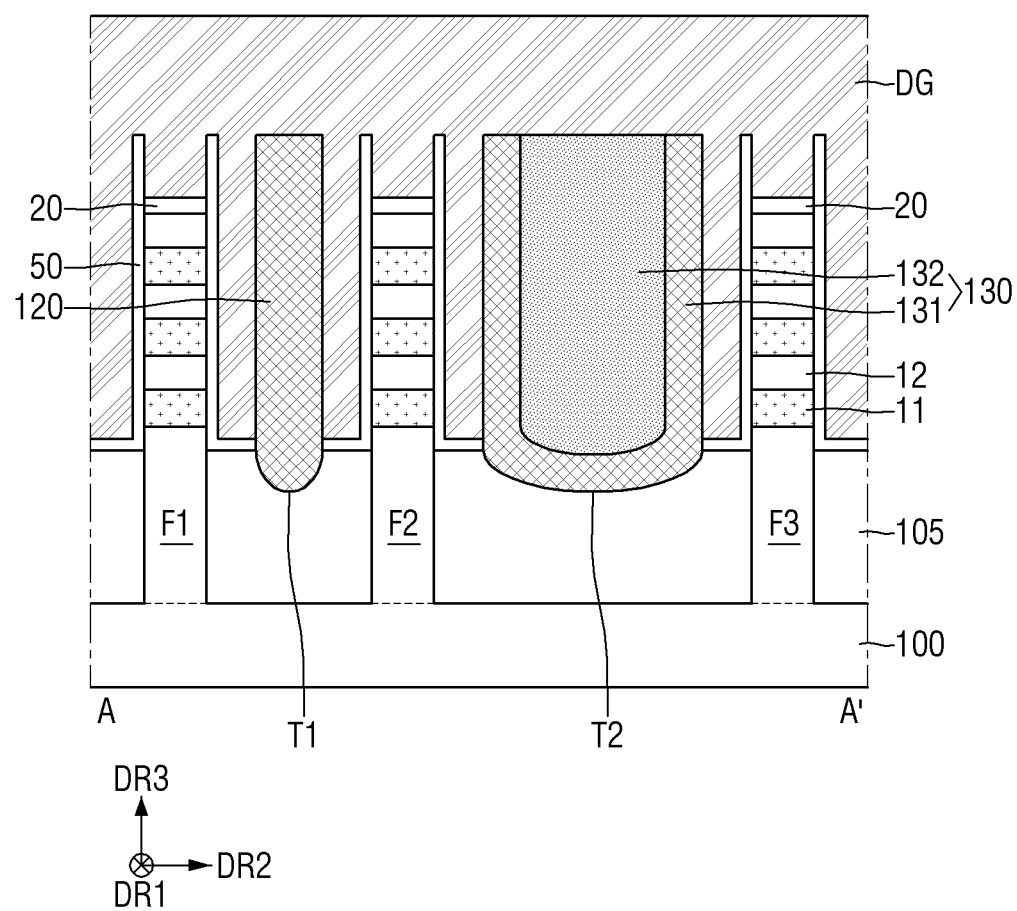

Referring to FIG. 24, a layer including the same material as the dummy gate liner layer 30 may be formed on the dummy gate liner layer 30, the upper surface of the first insulating structure 120 and the upper surface of the second insulating structure 130. The layer including the same material as the dummy gate liner layer 30 may also be formed in the portion from which the first mask pattern M1 is removed. A dummy gate DG including the dummy gate liner layer 30 may be formed accordingly. Subsequently, although not shown in FIG. 24, a first interlayer insulating layer (150 of FIGS. 3 and 4) may be formed to cover or overlap the side walls of the dummy gate DG.

Figure 25:
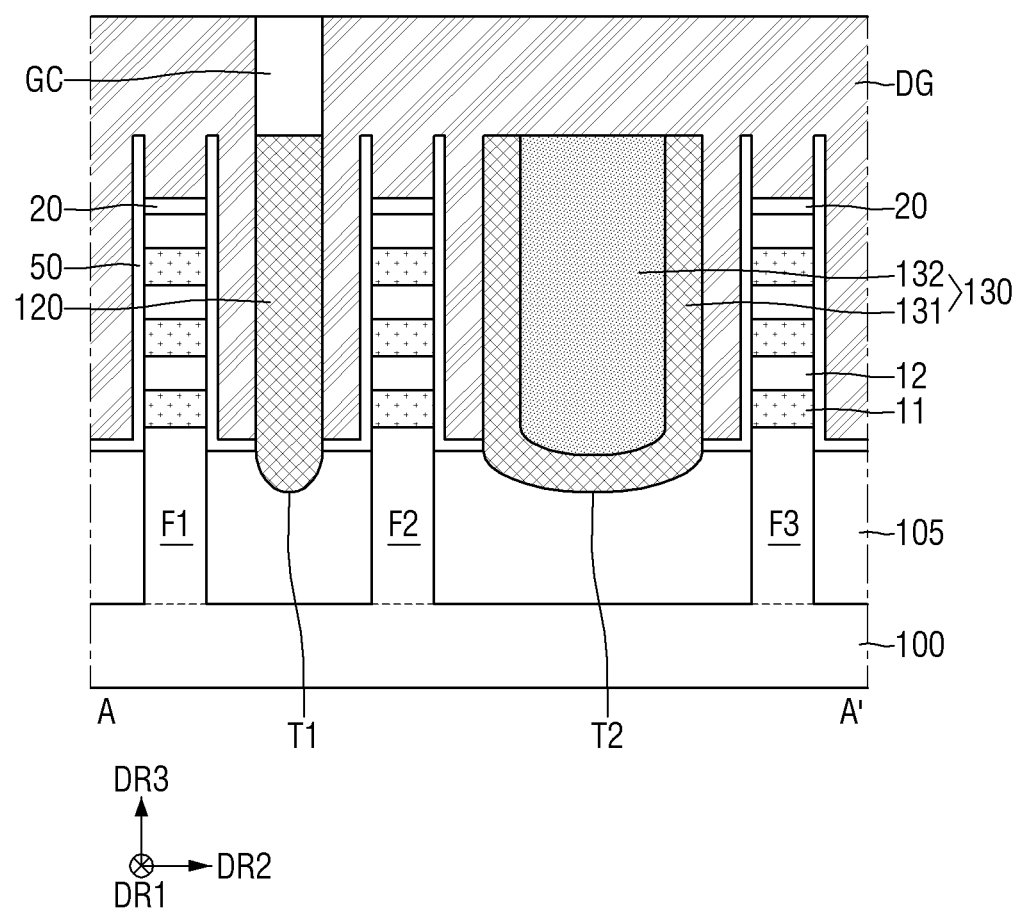

Referring to FIG. 25, the dummy gate DG formed on the first insulating structure 120 may be etched. Subsequently, the gate-cut GC may be formed in the portion in which the dummy gate DG is etched.

Figure 26:
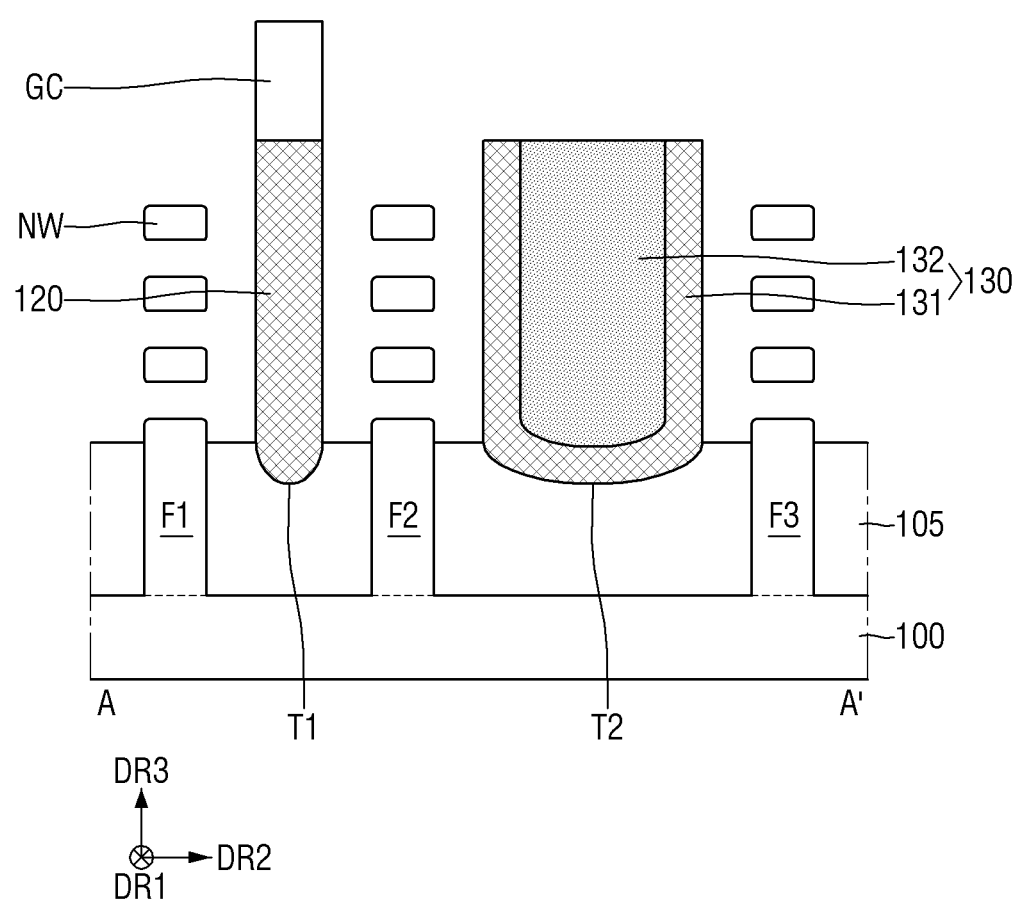

Referring to FIG. 26, the dummy gate DG, the pad insulating layer 20, the first liner layer 50, and the first semiconductor layer 11 may be removed.

Subsequently, the gate insulating layer 111, the first to fourth gate electrodes G1, G2, G3 and G4, and the capping pattern 113 are sequentially formed to form the structure shown in FIG. 17.

Subsequently, the first interlayer insulating layer 150, the gate contact 160, the source/drain contact 165, the silicide layer 145, the etching stop layer 155, the second interlayer insulating layer 170, the first via 181 and the second via 182 are formed, and the semiconductor device shown in FIGS. 1 to 4 may be manufactured.

Hereinafter, a semiconductor device according to some embodiments of the present disclosure will be described referring to FIG. 27. Differences from the semiconductor device shown in FIGS. 1 to 4 will be mainly described.

Figure 27:
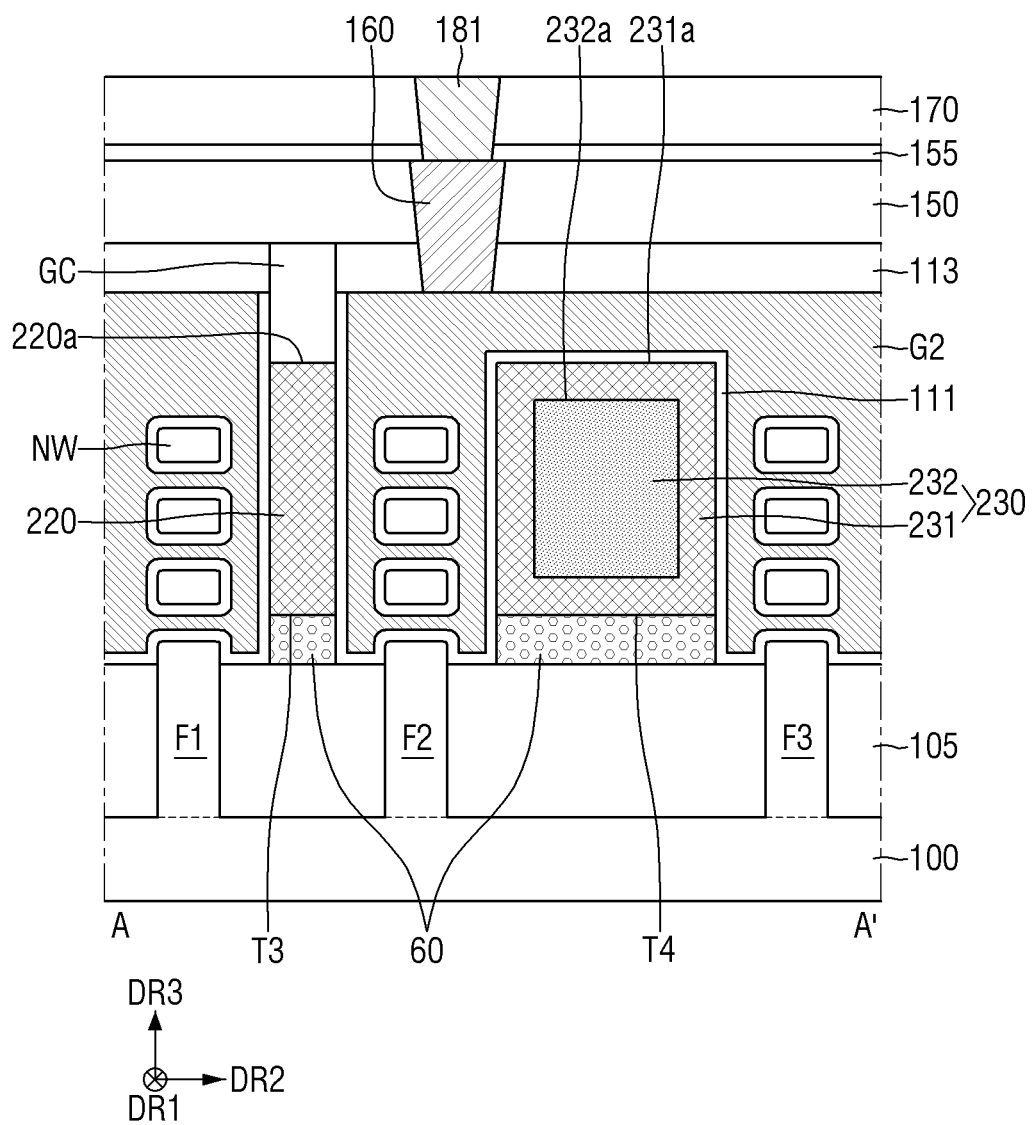
FIG. 27 is a cross-sectional view for explaining a semiconductor device according to some embodiments of the present disclosure.

FIG. 27 is a cross-sectional view for explaining a semiconductor device according to some embodiments of the present disclosure.

Referring to FIG. 27, a semiconductor device according to some embodiments of the present disclosure may have a second liner layer 60 disposed below the first insulating structure 220 and the second insulating structure 230.

The side walls of the second liner layer 60 disposed below the first insulating structure 220 may be arranged with the side walls of the first insulating structure 220 in the vertical direction DR3. Further, the side walls of the second liner layer 60 disposed below the second insulating structure 230 may be arranged with the side walls of the second insulating structure 230 in the vertical direction DR3.

The second liner layer 60 disposed below the first insulating structure 220 may be in contact with each of the first insulating structure 220 and the field insulating layer 105. The second liner layer 60 disposed below the second insulating structure 230 may be in contact with each of the second insulating structure 230 and the field insulating layer 105. Although the second liner layer 60 may include, for example, silicon oxide ($SiO_2$), the present disclosure is not limited thereto.

The first insulating structure 220 may be disposed inside a third trench T3 formed on the second liner layer 60 between the first active pattern F1 and the second active pattern F2. The second insulating structure 230 may be disposed inside a fourth trench T4 formed on the second liner layer 60 between the second active pattern F2 and the third active pattern F3.

The second insulating structure 230 may be disposed inside the fourth trench T4. The second insulating structure 230 may include a first insulating layer 231 and a second insulating layer 232. The first insulating layer 231 may form a bottom surface, side walls and an upper surface of the fourth trench T4. That is, the first insulating layer 231 may also be disposed on the upper surface 232a of the second insulating layer 232. The second insulating layer 232 may be disposed inside the first insulating layer 231. That is, the second insulating layer 232 may be surrounded by the first insulating layer 231 in a cross-sectional view of the semiconductor device. The upper surface 220a of the first insulating structure 220 may be formed on the same plane as the upper surface 231a of the first insulating layer 231.

Hereinafter, a method for manufacturing the semiconductor device shown in FIG. 27 will be described referring to FIGS. 28 to 39. Differences from the method for manufacturing the semiconductor device shown in FIGS. 5 to 17 will be mainly described.

FIGS. 28 to 39 are intermediate stage diagrams for explaining a method for manufacturing a semiconductor device according to some embodiments of the present disclosure.

Figure 28:
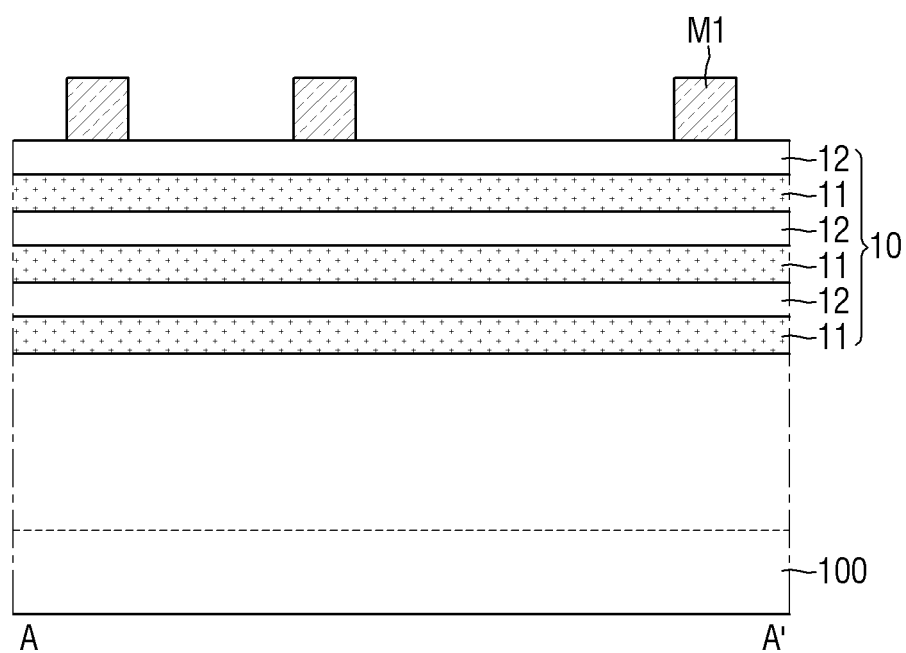
FIGS. 28 to 39 are intermediate stage diagrams for explaining a method for manufacturing a semiconductor device according to some embodiments of the present disclosure.

Referring to FIG. 28, the stacked structure 10 in which the first semiconductor layer 11 and the second semiconductor layer 12 are alternately stacked may be formed on the substrate 100. For example, the first semiconductor layer 11 may be formed at the lowermost part of the stacked structure 10, and the second semiconductor layer 12 may be formed at the uppermost part of the stacked structure 10. Subsequently, the first mask pattern M1 may be formed on the stacked structure 10.

Figure 29:
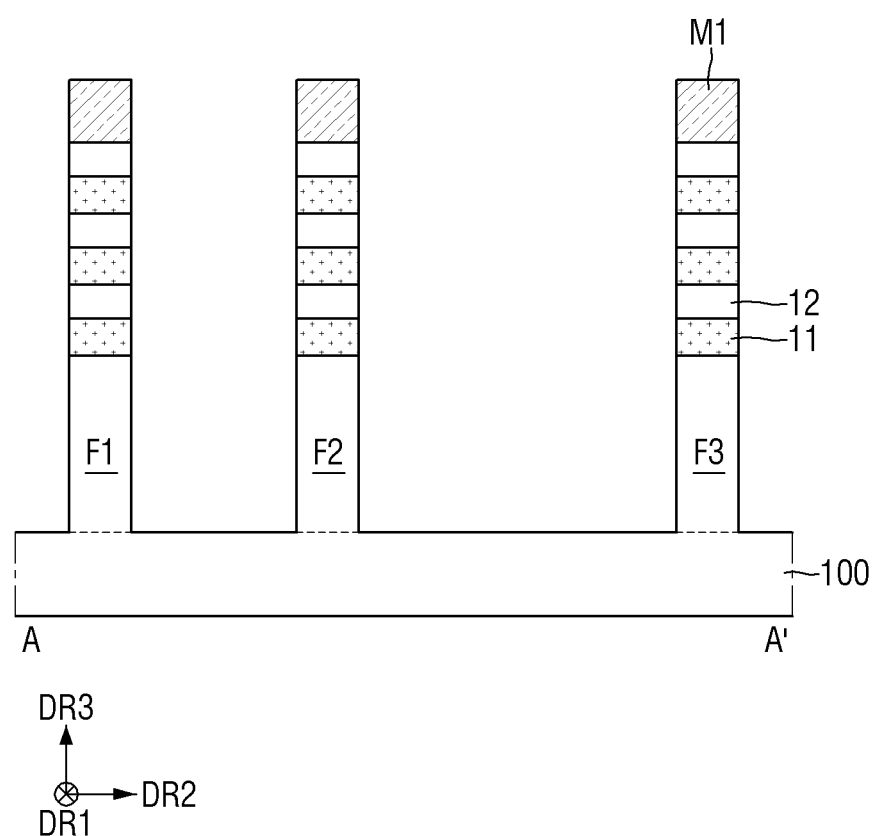

Referring to FIG. 29, some of the pad insulating layer 20, the stacked structure 10 and the substrate 100 may be etched, using the first mask pattern M1 as a mask. The first to third active patterns F1, F2 and F3 may be formed on the substrate 100 through the etching process.

Figure 30:
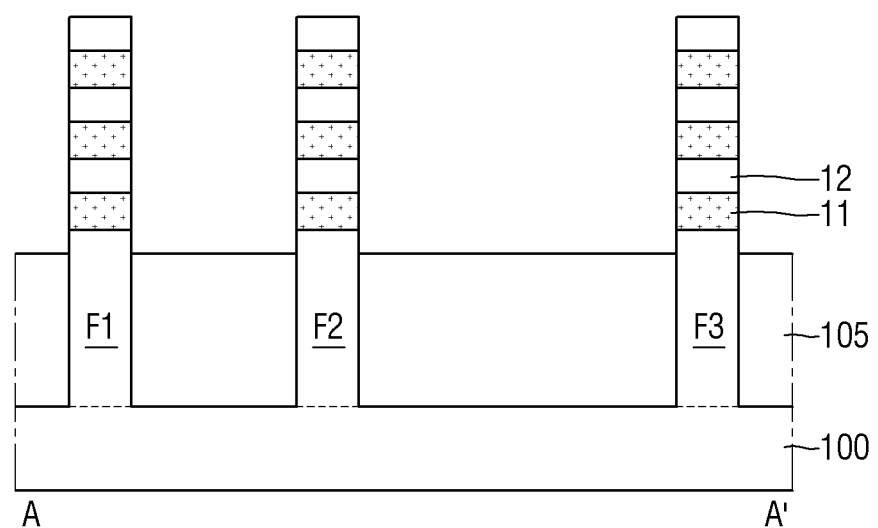

Referring to FIG. 30, the field insulating layer 105 may be formed on the substrate 100. The field insulating layer 105 may surround or overlap the side walls of each of the first to third active patterns F1, F2 and F3. The upper surface of the field insulating layer 105 may be formed to be lower than the upper surfaces of each of the first to third active patterns F1, F2 and F3. Subsequently, the first mask pattern M1 may be removed.

Figure 31:
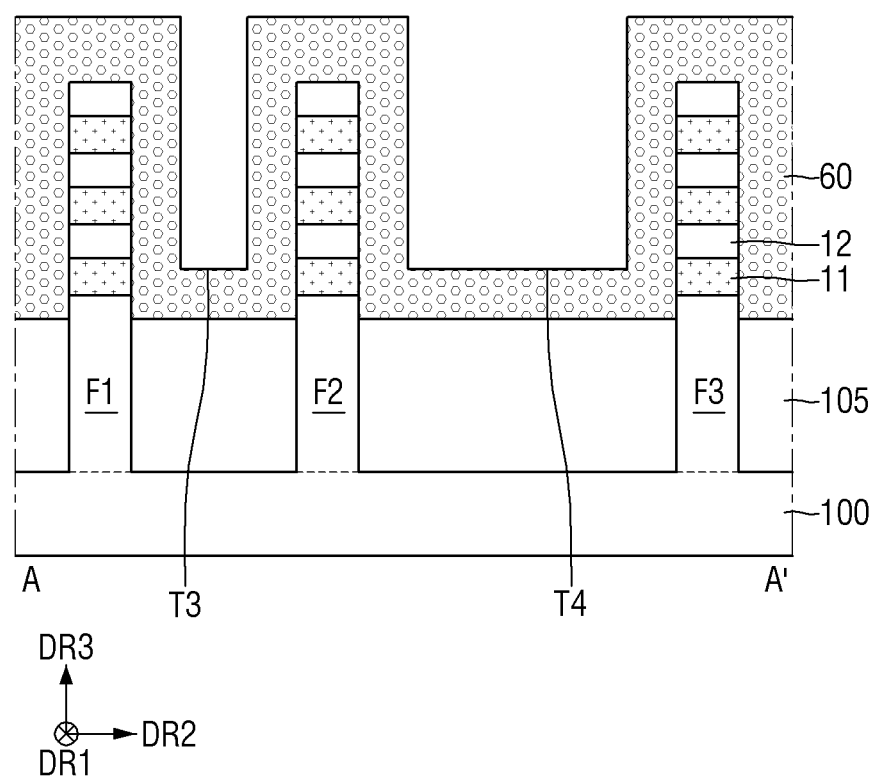

Referring to FIG. 31, the second liner layer 60 may be formed on the upper surface of the exposed field insulating layer 105, the side walls of each of the first to third active patterns F1, F2 and F3 exposed on the field insulating layer 105, the side walls of the first semiconductor layer 11, and the second semiconductor layer 12. For example, the second liner layer 60 may be conformally formed.

A third trench T3 may be defined by the second liner layer 60 formed between the first active pattern F1 and the second active pattern F2. Further, a fourth trench T4 may be defined by the second liner layer 60 formed between the second active pattern F2 and the third active pattern F3.

Figure 32:
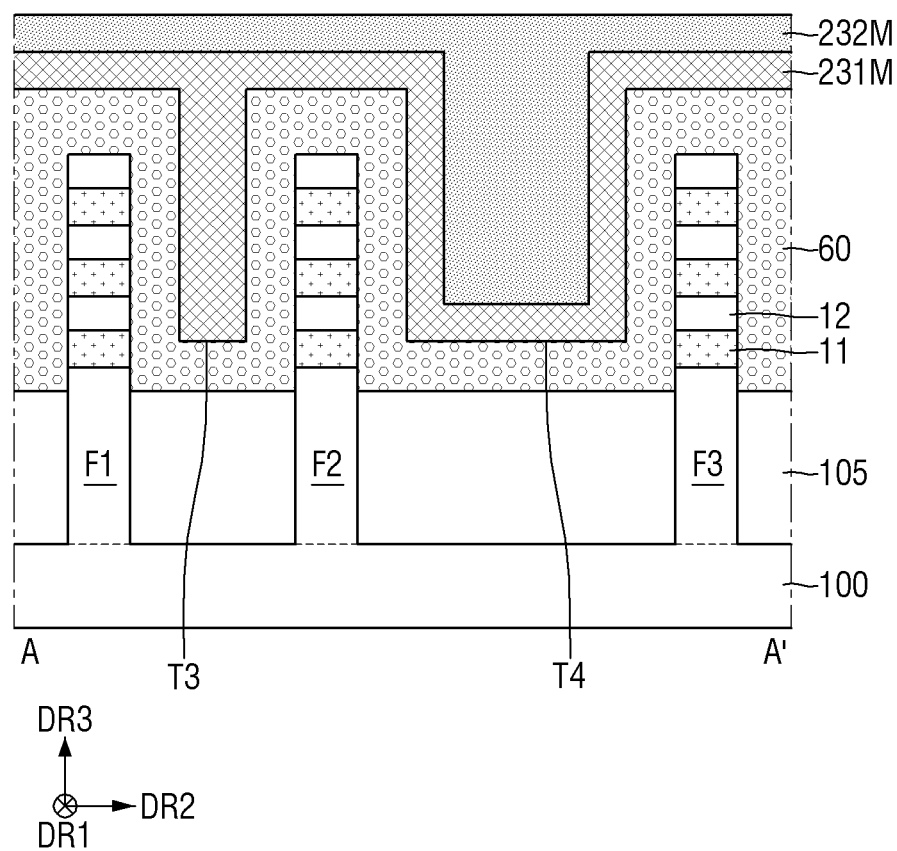

Referring to FIG. 32, a first insulating material layer 231M may be formed on the second liner layer 60. For example, the first insulating material layer 231M may be formed conformally. The first insulating material layer 231M may completely fill the third trench T3. The first insulating material layer 231M may be formed along the side walls and the bottom surface of the fourth trench T4.

Subsequently, a second insulating material layer 232M may be formed on the first insulating material layer 231M. The second insulating material layer 232M may completely fill or at least partially fill the fourth trench T4 on the first insulating material layer 231M.

Figure 33:
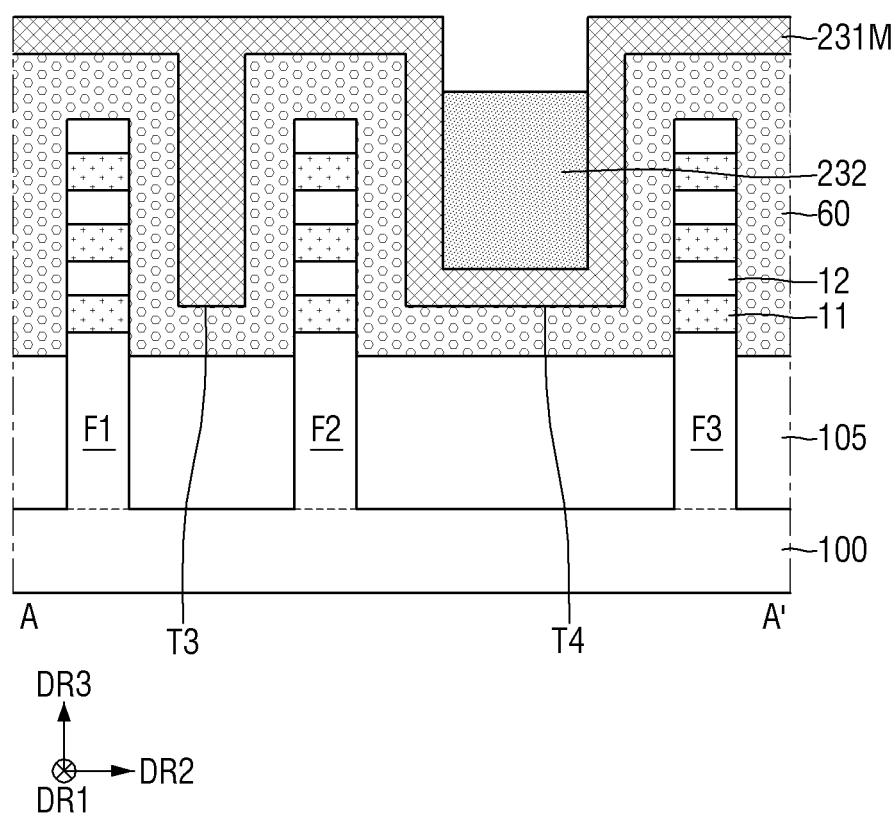

Referring to FIG. 33, the second insulating material layer 232M may be etched through the etch back etching process to form a second insulating layer 232 inside the fourth trench T4. The upper surface of the second insulating layer 232 may be formed to be lower than the uppermost surface of the second liner layer 60.

Figure 34:
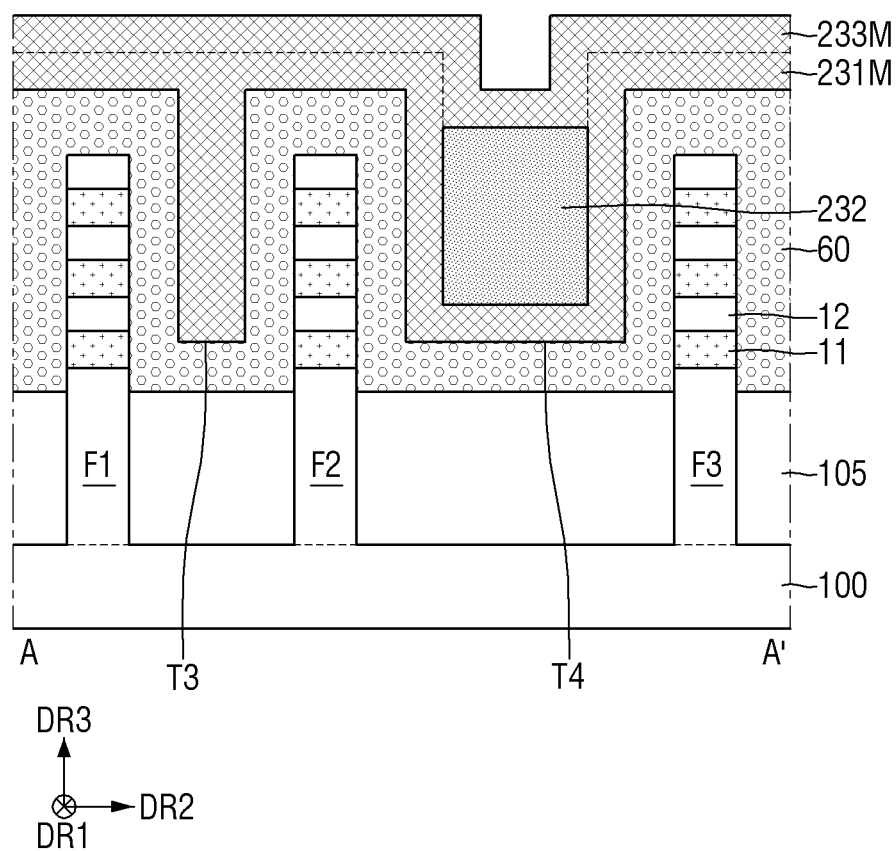

Referring to FIG. 34, a third insulating material layer 233M may be formed on the upper surfaces of the first insulating material layer 231M and the second insulating layer 232. For example, the third insulating material layer 233M may be conformally formed. The third insulating material layer 233M may include, for example, the same material as the first insulating material layer 231M.

Figure 35:
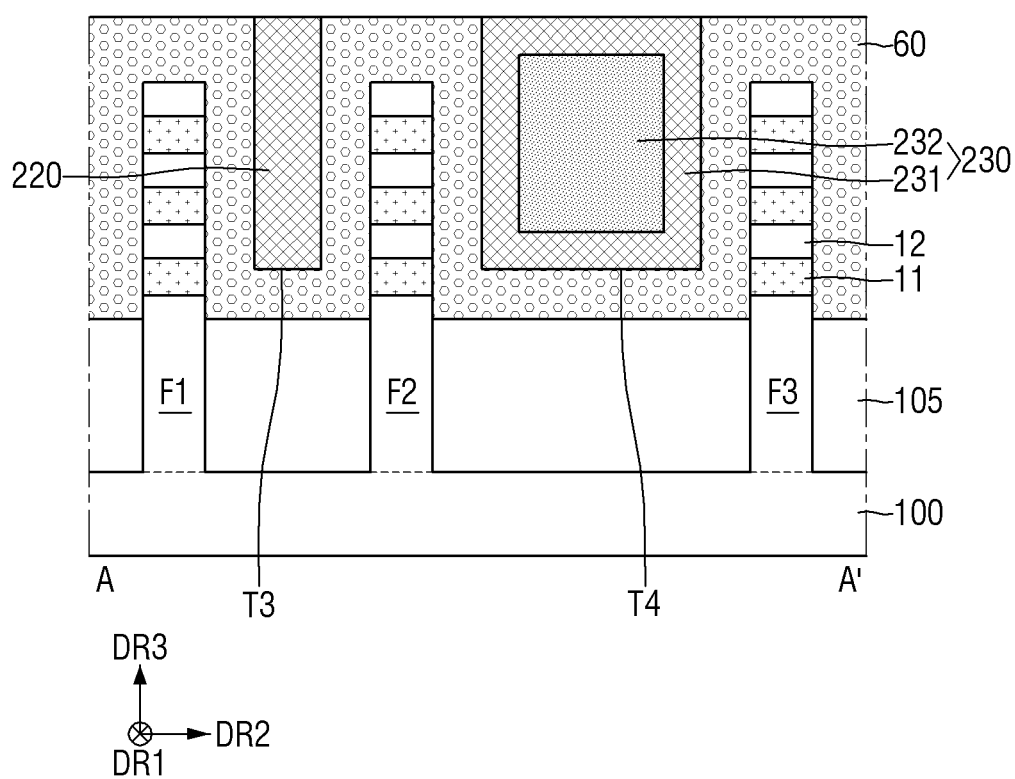

Referring to FIG. 35, a part of the first insulating material layer 231M and a part of the third insulating material layer 233M may be etched through the flattening process. The uppermost surface of the second liner layer 60 may be exposed through the flattening process. The first insulating structure 220 may be formed inside the third trench T3 through the flattening process. Further, the second insulating structure 230 may be formed inside the fourth trench T4 through the flattening process.

Figure 36:
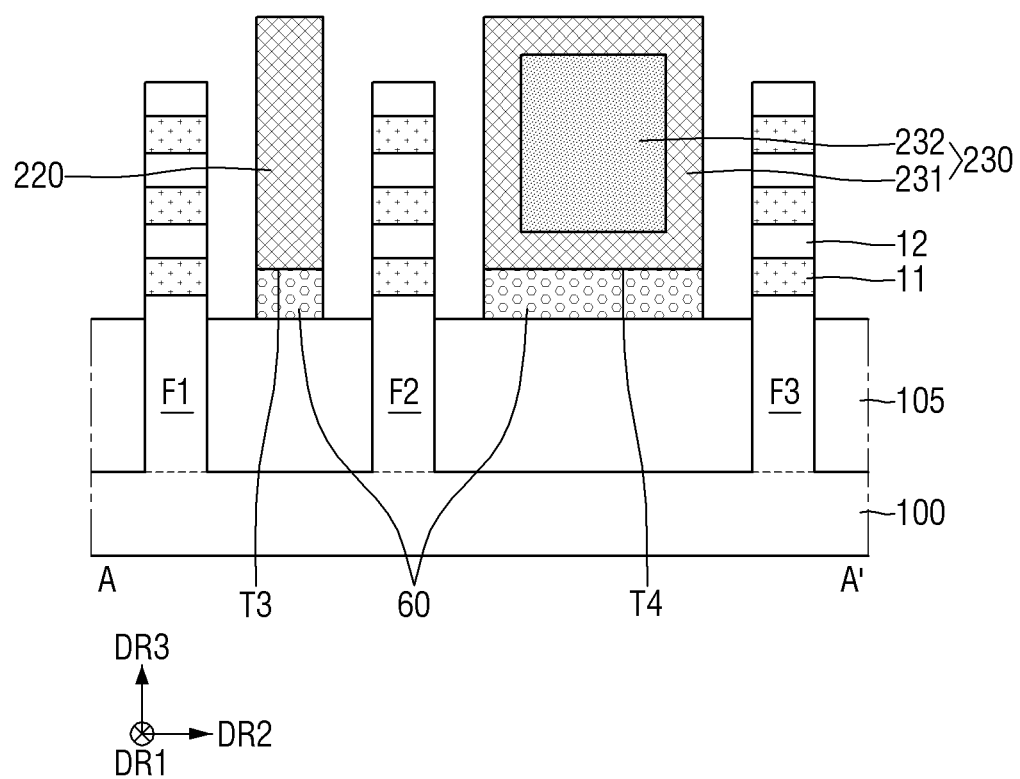

Referring to FIG. 36, the remaining second liner layer 60 may be etched, except for the second liner layer 60 formed in each of the lower part of the first insulating structure 220 and the lower part of the second insulating structure 230.

Figure 37:
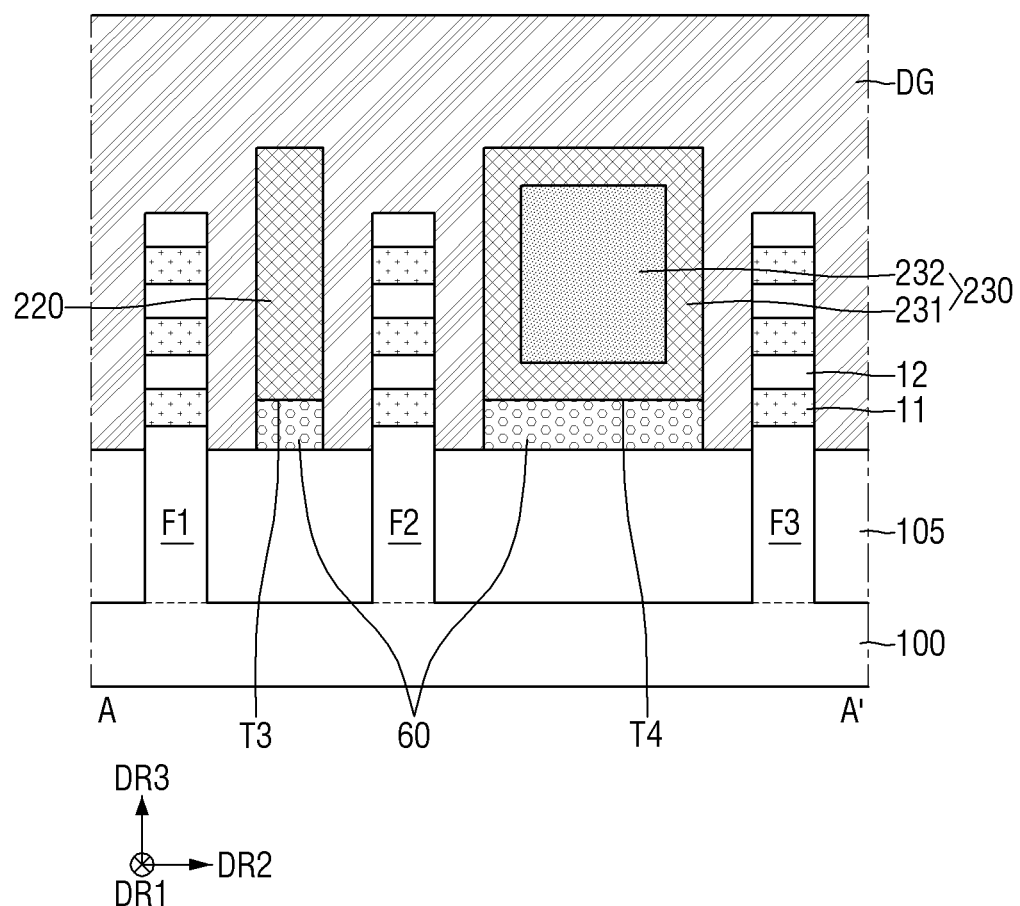

Referring to FIG. 37, a dummy gate DG may be formed on the upper surface of the exposed field insulating layer 105, the side walls of each of the first to third active patterns F1, F2 and F3 exposed on the field insulating layer 105, the side walls of the first semiconductor layer 11, the second semiconductor layer 12, the side walls of the second liner layer 60, the first insulating structure 220, and the second insulating structure 230.

Subsequently, although not shown in FIG. 37, a first interlayer insulating layer (150 of FIG. 27) may be formed to cover the side walls of the dummy gate DG.

Figure 38:
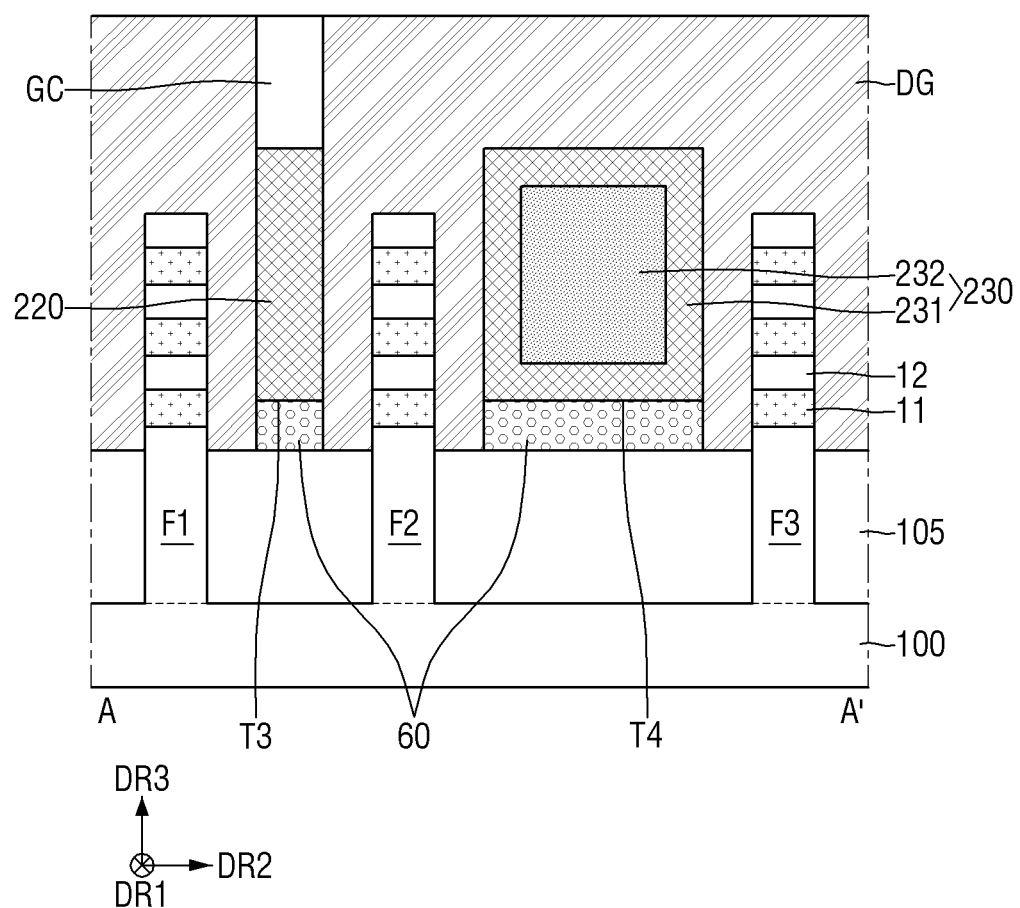

Referring to FIG. 38, the dummy gate DG formed on the first insulating structure 220 may be etched. Subsequently, the gate-cut GC may be formed in the portion in which the dummy gate DG is etched.

Figure 39:
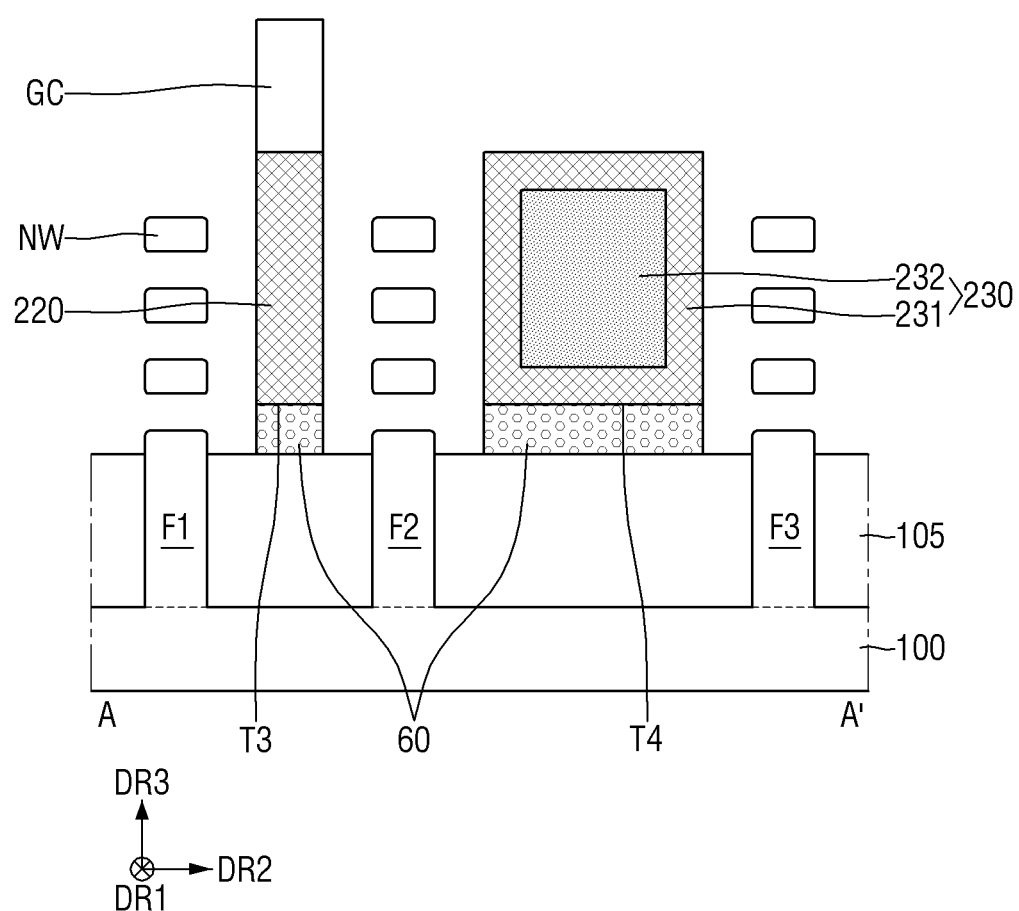

Referring to FIG. 39, the dummy gate DG and the first semiconductor layer 11 may be removed.

Referring to FIG. 27, the gate insulating layer 111, the first to fourth gate electrodes G1, G2, G3 and G4, and the capping pattern 113 may be sequentially formed.

Subsequently, the first interlayer insulating layer 150, the gate contact 160, the source/drain contact 165, the silicide layer 145, the etching stop layer 155, the second interlayer insulating layer 170, the first via 181 and the second via 182 are formed, and the semiconductor device shown in FIG. 27 may be manufactured.

Hereinafter, a semiconductor device according to some embodiments of the present disclosure will be described referring to FIG. 40. Differences from the semiconductor devices shown in FIGS. 1 to 4 will be mainly described.

Figure 40:
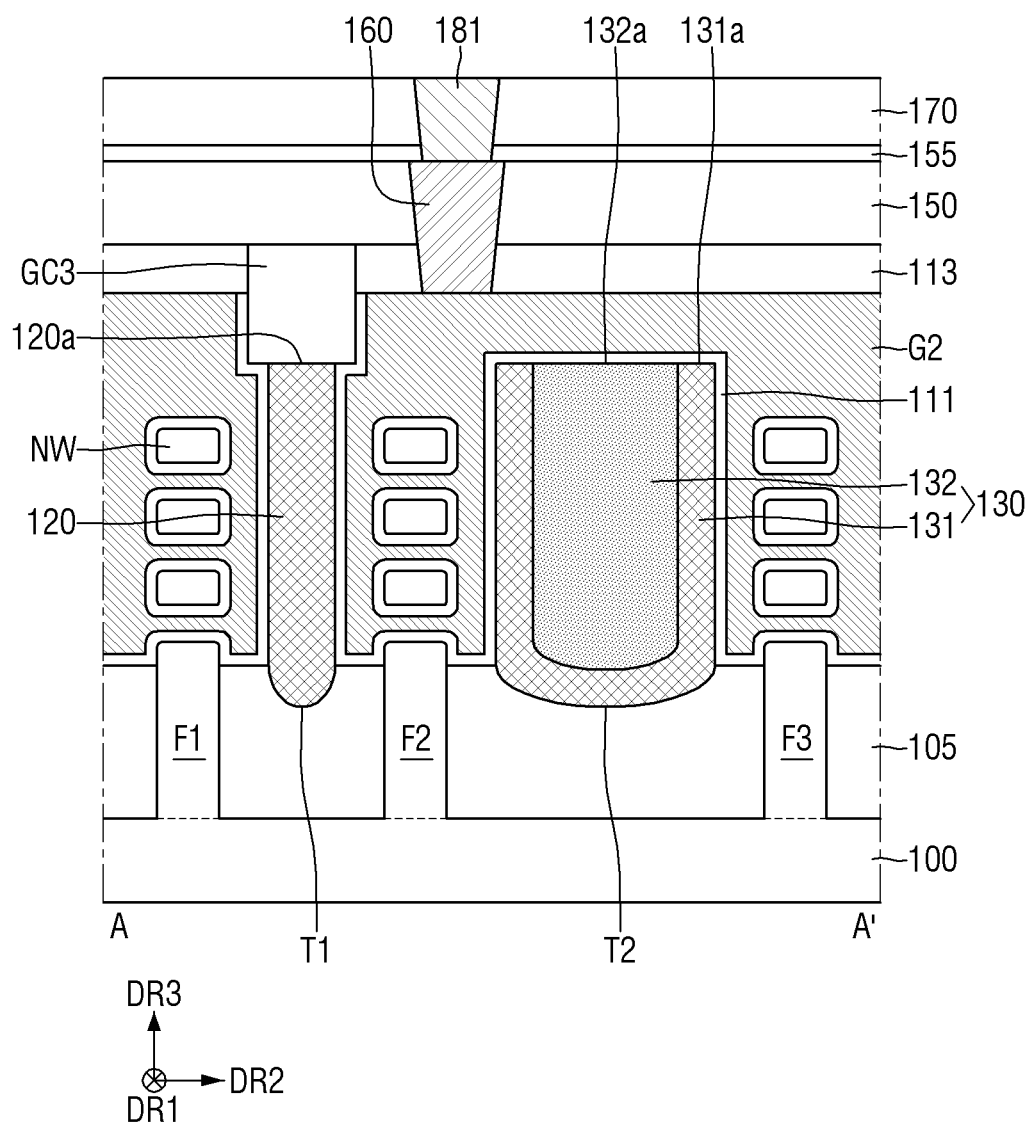
FIG. 40 is a cross-sectional view for explaining a semiconductor device according to some embodiments of the present disclosure.

FIG. 40 is a cross-sectional view for explaining a semiconductor device according to some embodiments of the present disclosure.

Referring to FIG. 40, in the semiconductor device according to some embodiments of the present disclosure, a width of the lower surface of the gate-cut GC3 in the second horizontal direction DR2 may be greater than the width of the upper surface 120a of the first insulating structure 120 in the second horizontal direction DR2.

Hereinafter, a semiconductor device according to some embodiments of the present disclosure will be described referring to FIG. 41. Differences from the semiconductor devices shown in FIGS. 1 to 4 will be mainly described.

Figure 41:
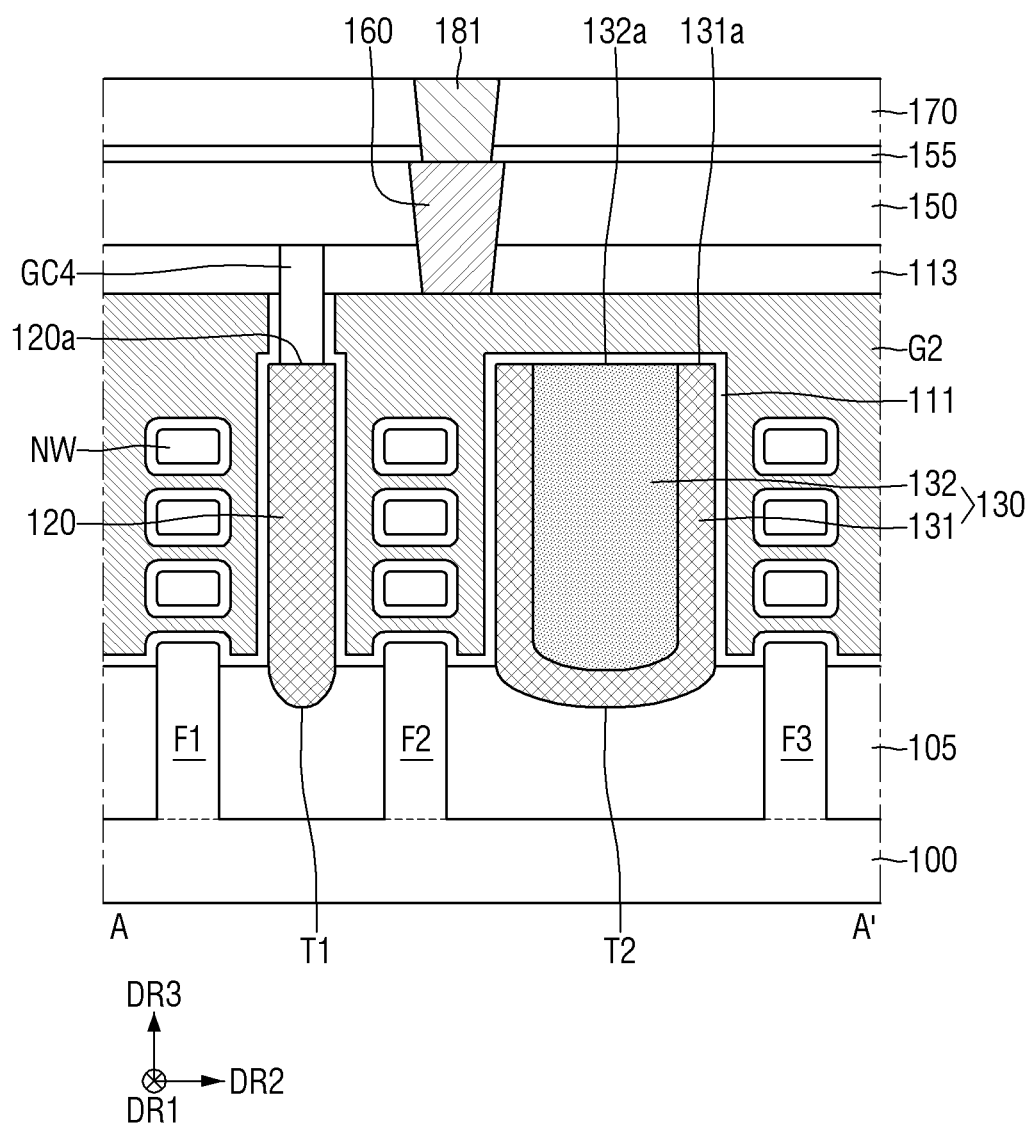
FIG. 41 is a cross-sectional view for explaining a semiconductor device according to some embodiments of the present disclosure.

FIG. 41 is a cross-sectional view for explaining a semiconductor device according to some embodiments of the present disclosure.

Referring to FIG. 41, in the semiconductor device according to some embodiments of the present disclosure, a width of the lower surface of the gate-cut GC4 in the second horizontal direction DR2 may be smaller than a width of the upper surface 120a of the first insulating structure 120 in the second horizontal direction DR2.

Hereinafter, a semiconductor device according to some embodiments of the present disclosure will be described referring to FIG. 42. Differences from the semiconductor devices shown in FIGS. 1 to 4 will be mainly described.

Figure 42:
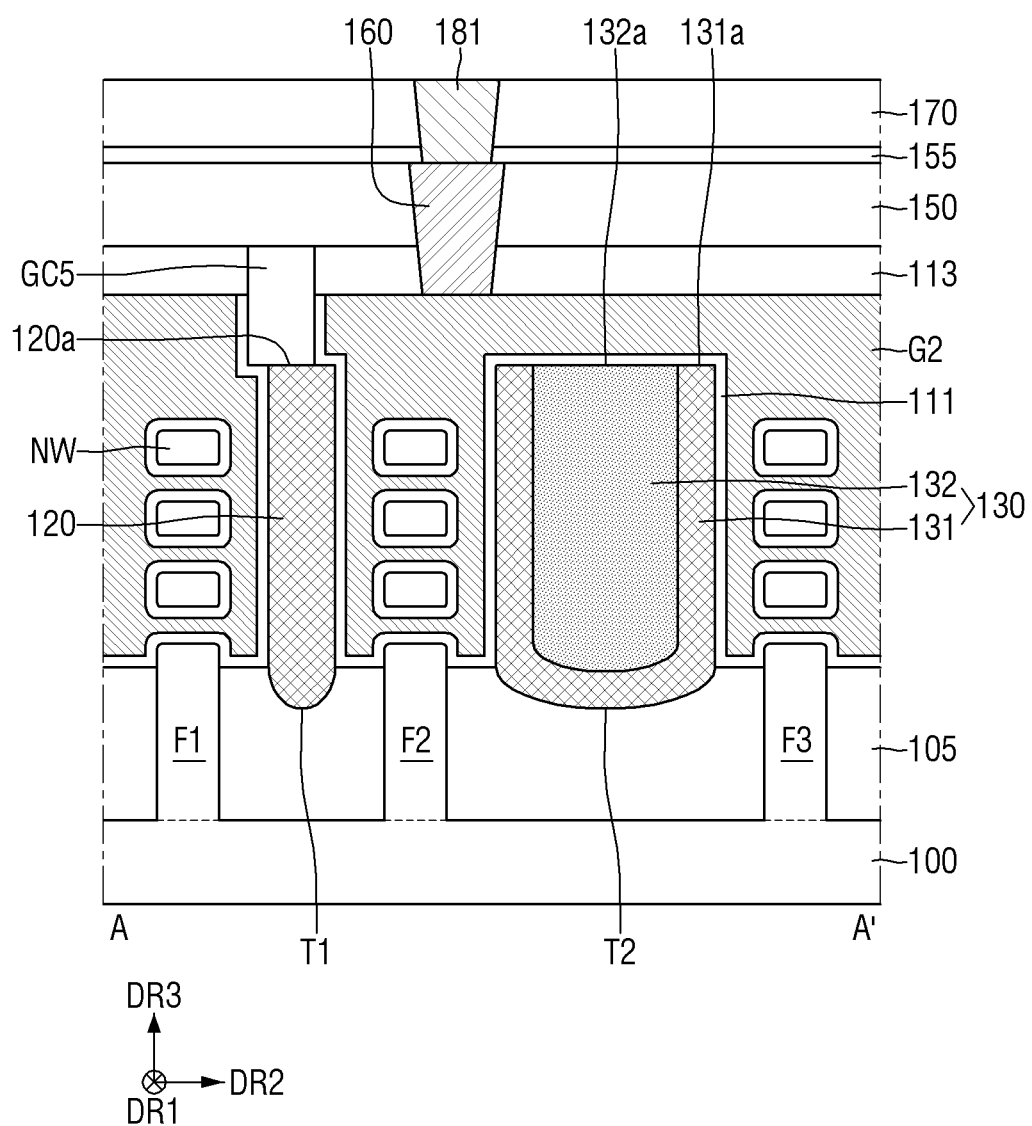
FIG. 42 is a cross-sectional view for explaining a semiconductor device according to some embodiments of the present disclosure.

FIG. 42 is a cross-sectional view for explaining a semiconductor device according to some embodiments of the present disclosure.

Referring to FIG. 42, in the semiconductor device according to some embodiments of the present disclosure, a gate-cut GC5 may be mis-aligned with the first insulating structure 120.

For example, the gate-cut GC5 may include a first side wall, and a second side wall that is opposite to the first side wall in the second horizontal direction DR2. The first side wall of the gate-cut GC5 may overlap the second gate electrode G2 in the vertical direction DR3. The second side wall of the gate-cut GC5 may overlap the first insulating structure 120 in the vertical direction DR3.

Hereinafter, a semiconductor device according to some embodiments of the present disclosure will be described referring to FIGS. 43 to 45. Differences from the semiconductor device shown in FIGS. 1 to 4 will be mainly described.

Figure 43:
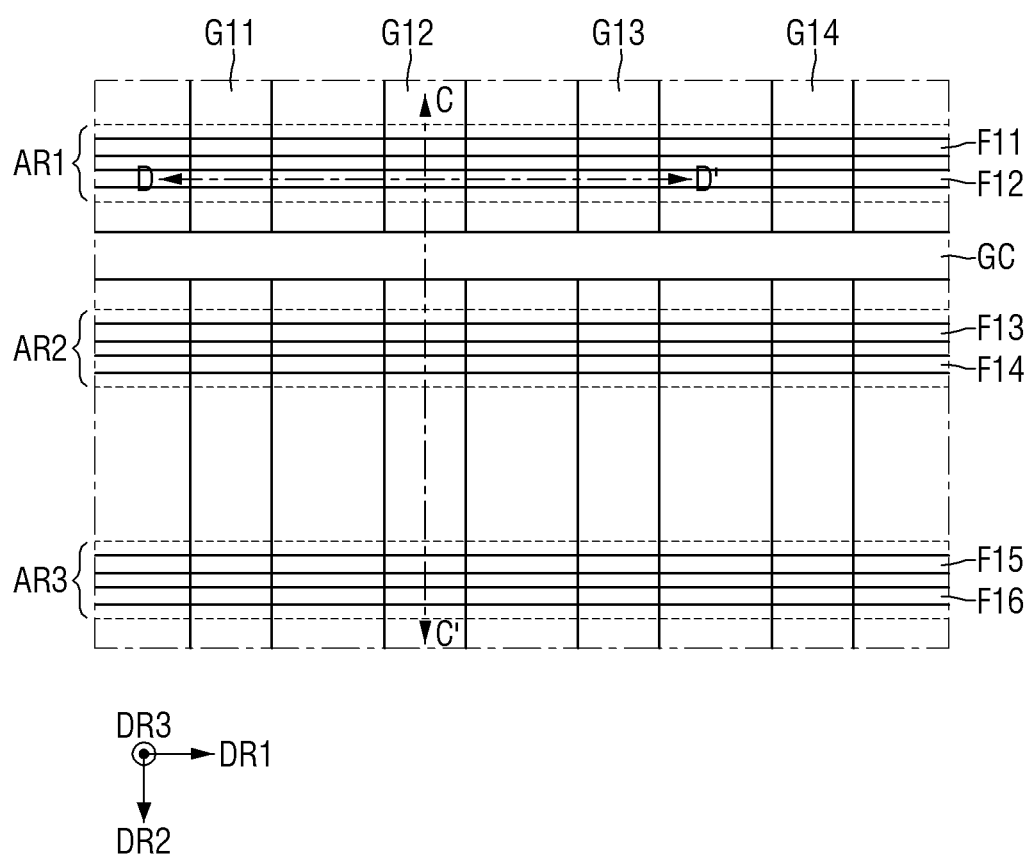
FIG. 43 is a schematic layout diagram for explaining a semiconductor device according to some embodiments of the present disclosure.

FIG. 43 is a schematic layout diagram for explaining a semiconductor device according to some embodiments of the present disclosure. FIG. 44 is a cross-sectional view taken along a line C-C' of FIG. 43. FIG. 45 is a cross-sectional view taken along a line D-D' of FIG. 43.

Figure 44:
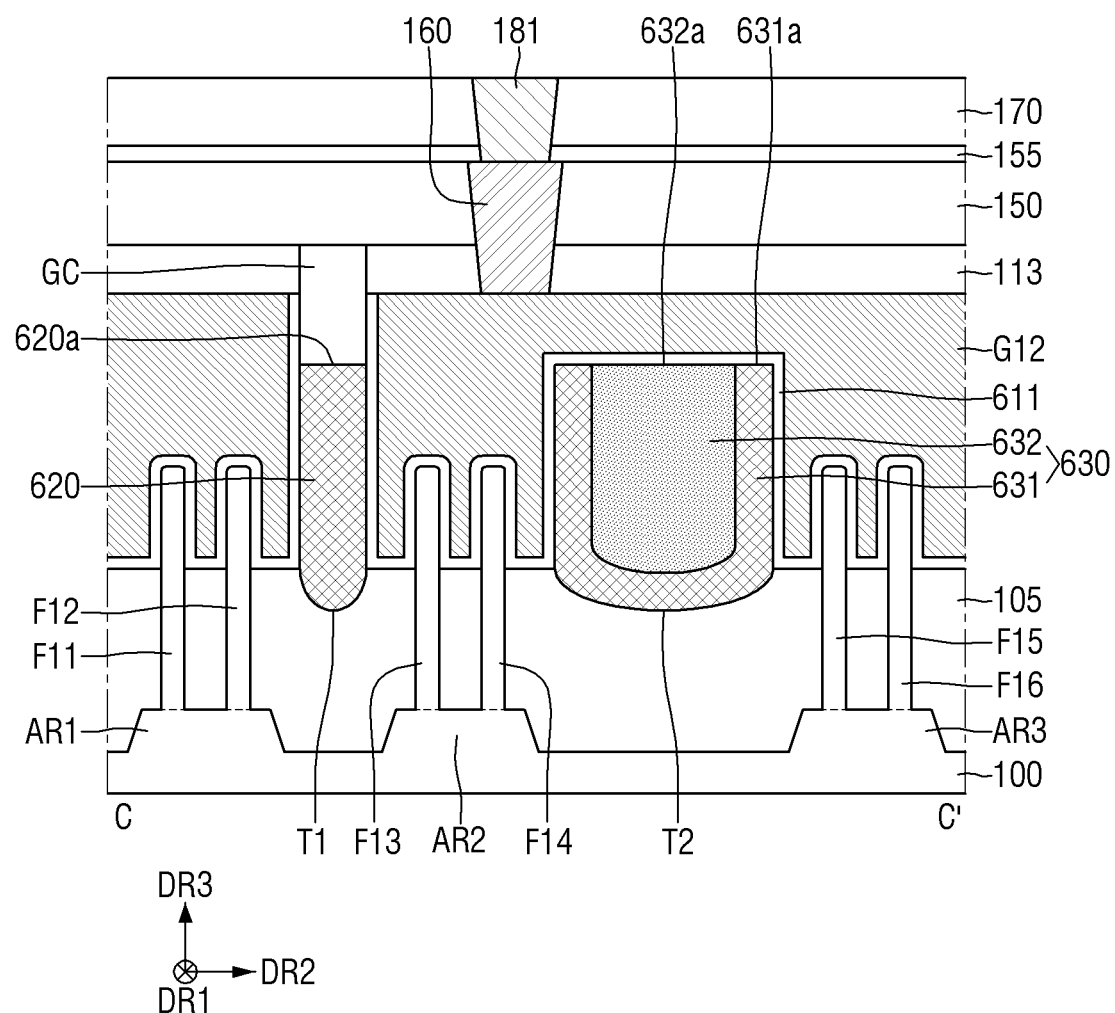
FIG. 44 is a cross-sectional view taken along a line C-C' of FIG. 43.
Figure 45:
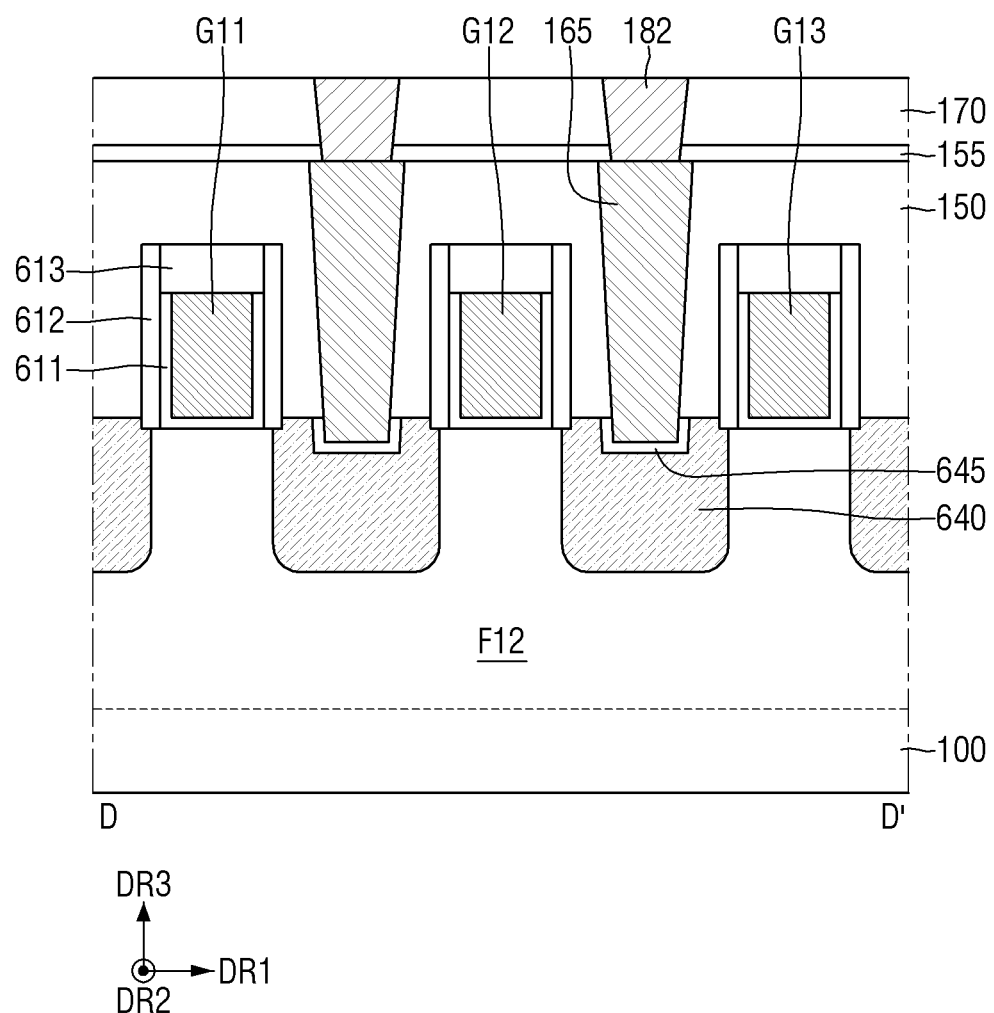
FIG. 45 is a cross-sectional view taken along a line D-D' of FIG. 43.

Referring to FIGS. 43 to 45, the semiconductor device according to some embodiments of the present disclosure may include a fin-type transistor (FinFET). For example, the semiconductor device according to some embodiments of the present disclosure includes a substrate 100, first to third active regions AR1, AR2 and AR3, first to sixth active patterns F11 to F16, a field insulating layer 105, first to fourth gate electrodes G11, G12, G13 and G14, a gate insulating layer 611, a gate spacer 612, a capping pattern 613, a first insulating structure 620, a second insulating structure 630, a gate-cut GC, a source/drain region 640, a silicide layer 645, a first interlayer insulating layer 150, an etching stop layer 155, a gate contact 160, a source/drain contact 165, a second interlayer insulating layer 170, a first via 181, and a second via 182.

Each of the first to third active regions AR1, AR2 and AR3 may protrude from the substrate 100 in the vertical direction DR3. The field insulating layer 105 may be disposed between the first to third active regions AR1, AR2 and AR3.

A first active region AR1 may extend in the first horizontal direction DR1. A second active region AR2 may be spaced apart from the first active region AR1 in the second horizontal direction DR2. The second active region AR2 may extend in the first horizontal direction DR1. A third active region AR3 may be spaced apart from the second active region AR2 in the second horizontal direction DR2. The third active region AR3 may extend in the first horizontal direction DR1.

Each of the first active pattern F11 and the second active pattern F12 may extend in the first horizontal direction DR1 on the first active region AR1. The second active pattern F12 may be spaced apart from the first active pattern F11 in the second horizontal direction DR2. Each of the third active pattern F13 and the fourth active pattern F14 may extend in the first horizontal direction DR1 on the second active region AR2. The fourth active pattern F14 may be spaced apart from the third active pattern F13 in the second horizontal direction DR2. Each of a fifth active pattern F15 and a sixth active pattern F16 may extend in the first horizontal direction DR1 on the third active region AR3. The sixth active pattern F16 may be spaced apart from the fifth active pattern F15 in the second horizontal direction DR2.

Each of the first to fourth gate electrodes G11, G12, G13 and G14 may extend in the second horizontal direction DR2 on the field insulating layer 105 and the first to sixth active patterns F11 to F16. Each of the first to fourth gate electrodes G11, G12, G13 and G14 may intersect each of the first to sixth active patterns F11 to F16. Each of the first to fourth gate electrodes G11, G12, G13 and G14 may be sequentially spaced in the first horizontal direction DR1.

The first insulating structure 620 may be disposed inside the first trench T1 formed between the first active region AR1 and the second active region AR2. The second insulating structure 630 may be disposed inside the first trench T1 formed between the second active region AR2 and the third active region AR3. At least a part of the first insulating structure 620 and at least a part of the second insulating structure 630 may be disposed inside the field insulating layer 105.

The second insulating structure 630 may include a first insulating layer 631 that forms the side walls and the bottom surface, and a second insulating layer 632 disposed on the first insulating layer 631. The upper surface 620a of the first insulating structure 620, the upper surface 631a of the first insulating layer 631, and the upper surface 632a of the second insulating layer 632 may each be formed on the same plane.

The gate insulating layer 611 may be disposed between each of the first to fourth gate electrodes G11, G12, G13 and G14 and the gate spacer 612. The gate insulating layer 611 may be disposed between each of the first to fourth gate electrodes G11, G12, G13 and G14 and each of the first to sixth active patterns F11 to F16. The gate insulating layer 611 may be disposed between each of the first to fourth gate electrodes G11, G12, G13 and G14 and the field insulating layer 105.

Further, the gate insulating layer 611 may be disposed between each of the first to fourth gate electrodes G11, G12, G13 and G14 and the first insulating structure 620. The gate insulating layer 611 may be disposed between each of the first to fourth gate electrodes G11, G12, G13 and G14 and the second insulating structure 630. The gate insulating layer 611 may be disposed between each of the first to fourth gate electrodes G11, G12, G13 and G14 and the gate-cut GC.

The capping pattern 613 may be disposed on each of the first to fourth gate electrodes G11, G12, G13 and G14. The capping pattern 613 may surround or overlap the side walls of the gate-cut GC.

A source/drain region 640 may be disposed on at least one side of each of the first to fourth gate electrodes G11, G12, G13 and G14 on each of the first to sixth active patterns F11 to F16. A silicide layer 645 may be disposed between the source/drain region 640 and the source/drain contact 165.

In concluding the detailed description, those skilled in the art will appreciate that many variations and modifications may be made to the described embodiments without substantially departing from the principles of the present disclosure. Therefore, the disclosed embodiments of the disclosure are used in a generic and descriptive sense and not for purposes of limitation.

What is claimed is:

1. A semiconductor device comprising:
a substrate;
a first active pattern which extends in a first horizontal direction on the substrate, and comprises a first side wall and a second side wall opposite to the first side wall in a second horizontal direction different from the first horizontal direction;
a second active pattern which extends in the first horizontal direction on the first side wall of the first active pattern;
a third active pattern which extends in the first horizontal direction on the second side wall of the first active pattern;
a first insulating structure in a first trench extending in the first horizontal direction on the first side wall of the first active pattern;
a second insulating structure in a second trench extending in the first horizontal direction on the second side wall of the first active pattern, and comprising a first insulating layer on side walls and on a bottom surface of the second trench, and a second insulating layer in the second trench on the first insulating layer;
a gate-cut extending in the first horizontal direction on the first insulating structure; and
a gate electrode extending in the second horizontal direction on the first active pattern,
wherein the first insulating layer and the second insulating layer comprise different materials from each other,
wherein the first insulating structure and the first insulating layer comprise a same material,
wherein an upper surface of the first insulating structure is on a same plane as an upper surface of the second insulating layer, and
wherein a distance in the second horizontal direction between the second active pattern and the first active pattern is less than a distance in the second horizontal direction between the first active pattern and the third active pattern.

2. The semiconductor device of claim 1, further comprising:
a gate insulating layer between the gate electrode and the gate-cut.

3. The semiconductor device of claim 2, wherein the gate insulating layer is in contact with the upper surface of the second insulating layer.

4. The semiconductor device of claim 1, wherein a width of the upper surface of the first insulating structure in the second horizontal direction is less than a width of an upper surface of the second insulating structure in the second horizontal direction.

5. The semiconductor device of claim 1, wherein an upper surface of the first insulating layer is on the same plane as the upper surface of the second insulating layer.

6. The semiconductor device of claim 1, further comprising:
a plurality of nanosheets spaced apart from each other in a vertical direction on the first active pattern and surrounded by the gate electrode in the second horizontal direction and the vertical direction.

7. The semiconductor device of claim 1, further comprising:
a field insulating layer on side walls of the first active pattern on the substrate,
wherein at least a part of the first insulating structure and at least a part of the second insulating structure each extend into the field insulating layer.

8. The semiconductor device of claim 1, wherein a width of the upper surface of the first insulating structure in the second horizontal direction is different from a width of a lower surface of the gate-cut in the second horizontal direction.

9. The semiconductor device of claim 1,
wherein the gate-cut comprises a first side wall, and a second side wall that is opposite to the first side wall in the second horizontal direction,
wherein the first side wall of the gate-cut overlaps the gate electrode in a vertical direction, and
wherein the second side wall of the gate-cut overlaps the first insulating structure in the vertical direction.

10. A semiconductor device comprising:
a substrate;
a first active pattern which extends in a first horizontal direction on the substrate, and comprises a first side wall and a second side wall opposite to the first side wall in a second horizontal direction different from the first horizontal direction;
a second active pattern which extends in the first horizontal direction on the first side wall of the first active pattern;
a third active pattern which extends in the first horizontal direction on the second side wall of the first active pattern;
a plurality of nanosheets spaced apart from each other in a vertical direction on the first active pattern;
a first insulating structure in a first trench extending in the first horizontal direction on the first side wall of the first active pattern;
a second insulating structure in a second trench extending in the first horizontal direction on the second side wall of the first active pattern, and comprising a first insulating layer on side walls and a bottom surface of the second trench, and a second insulating layer in the second trench on the first insulating layer;
a gate-cut extending in the first horizontal direction on the first insulating structure;
a gate electrode which extends in the second horizontal direction on the first, second, and third active patterns and surrounds the plurality of nanosheets in the second horizontal direction; and
a gate insulating layer between the gate electrode and the plurality of nanosheets, and between the gate electrode and the gate-cut,
wherein a distance in the second horizontal direction between the second active pattern and the first active pattern is less than a distance in the second horizontal direction between the first active pattern and the third active pattern.

11. The semiconductor device of claim 10, wherein and upper surface of the first insulating structure is on a same plane as an upper surface of the second insulating layer.

12. The semiconductor device of claim 10,
wherein the first insulating layer and the second insulating layer comprise different materials from each other, and
wherein the first insulating structure and the first insulating layer comprise a same material.

13. The semiconductor device of claim 10, wherein the first insulating layer is on an upper surface of the second insulating layer.

14. The semiconductor device of claim 10,
wherein the gate insulating layer is in contact with an upper surface of the second insulating layer.

15. The semiconductor device of claim 10, wherein an upper surface of the first insulating layer is on a same plane as an upper surface of the second insulating layer.

16. The semiconductor device of claim 10, wherein a width of an upper surface of the first insulating structure in the second horizontal direction is different from a width of a lower surface of the gate-cut in the second horizontal direction.

17. The semiconductor device of claim 10, further comprising:
a field insulating layer on the first and the second side walls of the first active pattern on the substrate,
wherein at least a part of the first insulating structure and at least a part of the second insulating structure extend into the field insulating layer.

18. A semiconductor device comprising:
a substrate;
first, second, and third active patterns which each extend in a first horizontal direction on the substrate, and are spaced apart from one another in a second horizontal direction different from the first horizontal direction;
a field insulating layer on side walls of each of the first to third active patterns on the substrate;
a plurality of nanosheets, wherein first, second, and third groups of the plurality of nanosheets are on the first, second, and third active patterns respectively, wherein nanosheets of each of the first, second, and third groups of the plurality of nanosheets are spaced apart from each other in a vertical direction;
a first insulating structure in a first trench extending in the first horizontal direction between the first active pattern and the second active pattern, and at least partially extends into the field insulating layer;
a second insulating structure in a second trench extending in the first horizontal direction between the second active pattern and the third active pattern, and comprises a first insulating layer on side walls and a bottom surface of the second trench, and a second insulating layer in the second trench on the first insulating layer, wherein the second insulating structure at least partially extends into the field insulating layer;
a gate-cut extending in the first horizontal direction on the first insulating structure;
a gate electrode which extends in the second horizontal direction on the first to third active patterns and surrounds the plurality of nanosheets in the second horizontal direction;
a gate insulating layer between the gate electrode and the plurality of nanosheets, and between the gate electrode and the gate-cut; and
a source/drain region on at least one side of the gate electrode,
wherein the first insulating layer and the second insulating layer comprise different materials from each other,
wherein the first insulating structure and the first insulating layer comprise a same material, and
wherein an upper surface of the first insulating structure, an upper surface of the first insulating layer, and an upper surface of the second insulating layer are on a same plane as each other.

19. The semiconductor device of claim 18,
wherein a width of the upper surface of the first insulating structure in the second horizontal direction is less than a width of an upper surface of the second insulating structure in the second horizontal direction, and
wherein a distance in the second horizontal direction between the first active pattern and the second active pattern is less than a distance in the second horizontal direction between the second active pattern and the third active pattern.

* * * * *